US012464810B2

(12) United States Patent
Park et al.

(10) Patent No.: US 12,464,810 B2
(45) Date of Patent: Nov. 4, 2025

(54) INTEGRATED CIRCUIT DEVICE HAVING INCLINED STRUCTURES

(71) Applicant: Samsung Electronics Co., Ltd., Suwon-si (KR)

(72) Inventors: Juhun Park, Seoul (KR); Deokhan Bae, Suwon-si (KR); Myungyoon Um, Seoul (KR); Yuri Lee, Hwaseong-si (KR); Yoonyoung Jung, Suwon-si (KR); Sooyeon Hong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 628 days.

(21) Appl. No.: 17/569,795

(22) Filed: Jan. 6, 2022

(65) Prior Publication Data

US 2022/0375934 A1 Nov. 24, 2022

(30) Foreign Application Priority Data

May 18, 2021 (KR) ........................ 10-2021-0064219

(51) Int. Cl.
*H01L 27/088* (2006.01)
*H01L 21/8234* (2006.01)
(Continued)

(52) U.S. Cl.
CPC ......... *H10D 84/834* (2025.01); *H10D 30/024* (2025.01); *H10D 30/031* (2025.01);
(Continued)

(58) Field of Classification Search
CPC ......... H01L 27/0886; H01L 21/823431; H01L 21/823475; H01L 21/823481;
(Continued)

(56) References Cited

U.S. PATENT DOCUMENTS 9,401,415 B2 7/2016 Chang et al.
10,014,215 B2 7/2018 Labonte et al.
(Continued)

FOREIGN PATENT DOCUMENTS

EP 2519975 B1 5/2018
KR 10-2009-0099408 A 9/2009
(Continued)

OTHER PUBLICATIONS

Notice of Allowance for Korean Application No. 10-2021-0064219 dated May 28, 2025.

*Primary Examiner* — Eric W Jones
(74) *Attorney, Agent, or Firm* — Harness, Dickey & Pierce, P.L.C.

(57) ABSTRACT

An integrated circuit device includes: a first fin-type active region and a second fin-type active region that extend on a substrate in a straight line in a first horizontal direction and are adjacent to each other in the first horizontal direction; a fin isolation region arranged between the first fin-type active region and the second fin-type active region on the substrate and including a fin isolation insulation structure extending in a second horizontal direction perpendicular to the first horizontal direction; and a plurality of gate lines extending on the first fin-type active region in the second horizontal direction, wherein a first gate line that is closest to the fin isolation region from among the plurality of gate lines is inclined to be closer to a center of the fin isolation region in the first horizontal direction from a lowermost surface to an uppermost surface of the first gate line.

20 Claims, 37 Drawing Sheets

(51) Int. Cl.

| | |
|---|---|
| *H01L 29/06* | (2006.01) |
| *H01L 29/417* | (2006.01) |
| *H01L 29/423* | (2006.01) |
| *H01L 29/66* | (2006.01) |
| *H01L 29/78* | (2006.01) |
| *H01L 29/786* | (2006.01) |
| *H10D 30/01* | (2025.01) |
| *H10D 30/62* | (2025.01) |
| *H10D 30/67* | (2025.01) |
| *H10D 62/10* | (2025.01) |
| *H10D 64/01* | (2025.01) |
| *H10D 64/23* | (2025.01) |
| *H10D 84/01* | (2025.01) |
| *H10D 84/03* | (2025.01) |
| *H10D 84/83* | (2025.01) |

(52) U.S. Cl.
CPC ..... *H10D 30/6211* (2025.01); *H10D 30/6219* (2025.01); *H10D 30/6713* (2025.01); *H10D 30/6729* (2025.01); *H10D 30/6735* (2025.01); *H10D 62/118* (2025.01); *H10D 64/017* (2025.01); *H10D 64/021* (2025.01); *H10D 64/258* (2025.01); *H10D 84/0149* (2025.01); *H10D 84/0151* (2025.01); *H10D 84/0158* (2025.01); *H10D 84/038* (2025.01)

(58) Field of Classification Search
CPC .......... H01L 29/0665; H01L 29/41733; H01L 29/41775; H01L 29/41791; H01L 29/42392; H01L 29/66545; H01L 29/6656; H01L 29/66742; H01L 29/66795; H01L 29/7851; H01L 29/8618; H10D 84/834; H10D 84/0151; H10D 84/0158; H10D 84/038; H10D 84/0149; H10D 30/6211; H10D 30/024; H10D 30/6713; H10D 30/6735; H10D 30/6729; H10D 30/031; H10D 30/6219; H10D 64/258; H10D 64/021; H10D 64/017; H10D 62/118
USPC ....................................................... 257/288
See application file for complete search history.

(56) References Cited

U.S. PATENT DOCUMENTS

| | | | |
|---|---|---|---|
| 10,177,253 B2 | 1/2019 | Kim et al. | |
| 10,373,953 B2 * | 8/2019 | Kim | ................ H01L 29/1037 |
| 10,529,624 B2 | 1/2020 | Leobandung | |
| 10,825,810 B2 * | 11/2020 | Kim | .................. H01L 29/785 |
| 11,075,197 B2 | 7/2021 | Shin et al. | |
| 2008/0251883 A1 * | 10/2008 | Kitamura | ................ H10B 41/47 |
| | | | 257/E21.546 |
| 2010/0164051 A1 * | 7/2010 | Chae | ............... H01L 21/823437 |
| | | | 257/499 |
| 2016/0343709 A1 * | 11/2016 | Kim | .................... H01L 29/1037 |
| 2019/0088779 A1 * | 3/2019 | Kim | .................... H01L 29/7854 |
| 2019/0172752 A1 * | 6/2019 | Hsu | .................... H01L 21/31144 |
| 2019/0304973 A1 * | 10/2019 | Kim | .................... H01L 27/088 |
| 2020/0066705 A1 * | 2/2020 | Kim | ............... H01L 21/823821 |
| 2020/0365734 A1 | 11/2020 | Liaw | |

FOREIGN PATENT DOCUMENTS

| | | |
|---|---|---|
| KR | 20100078965 A | 7/2010 |
| KR | 20170043894 A | 4/2017 |
| KR | 20200022743 A | 3/2020 |
| KR | 20210011214 A | 2/2021 |

\* cited by examiner

INTEGRATED CIRCUIT DEVICE HAVING INCLINED STRUCTURES

CROSS-REFERENCE TO RELATED APPLICATION

This application is based on and claims priority under 35 U.S.C. § 119 to Korean Patent Application No. 10-2021-0064219, filed on May 18, 2021, in the Korean Intellectual Property Office, the disclosure of which is incorporated by reference herein in its entirety.

BACKGROUND

Inventive concepts relate to an integrated circuit device, and more particularly, to an integrated circuit device including a fin field-effect transistor.

As the down-scaling of integrated circuit devices is rapidly progressing, there is a desire to ensure a high operating speed in an integrated circuit device and accuracy in regard to operation. Accordingly, development of technology for integrated circuit devices is being pursued, whereby an insulation distance between wirings and contacts may be more stably ensured within a relatively small area and the reliability of the integrated circuit devices may be improved.

SUMMARY

Inventive concepts provide an integrated circuit device having a structure that allows to improve the reliability of the integrated circuit device having a device region of an area reduced according to down-scaling.

According to some example embodiments, there is provided an integrated circuit device including a first fin-type active region and a second fin-type active region, the first and second fin-type active regions extending on a substrate in a straight line in a first horizontal direction, the first and second fin-type active regions adjacent to each other in the first horizontal direction, a fin isolation region on the substrate and between the first fin-type active region and the second fin-type active region, the fin isolation region comprising a fin isolation insulation structure extending in a second horizontal direction that is perpendicular to the first horizontal direction, and a plurality of gate lines on the first fin-type active region and extending in the second horizontal direction. A first gate line that is closest to the fin isolation region from among the plurality of gate lines is inclined in the first horizontal direction, the inclination from a lowermost surface of the first gate line to an uppermost surface of the first gate line towards a center of the fin isolation region.

According to some example embodiments, there is provided an integrated circuit device including a first logic cell on a substrate, a second logic cell spaced apart from the first logic cell on the substrate in a first horizontal direction, a fin isolation region extending between the first logic cell and the second logic cell in a second horizontal direction that is perpendicular to the first horizontal direction, a first fin-type active region extending in the first logic cell in the first horizontal direction, a second fin-type active region extending in the second logic cell in the first horizontal direction, and a plurality of first gate lines extending on the first fin-type active region in the second horizontal direction. An outermost first gate line that is closest to the fin isolation region from among the plurality of first gate lines is inclined in the first horizontal direction, the inclination from a first lowermost surface of the outermost first gate line to a first uppermost surface of the outermost first gate line towards a center of the fin isolation region.

According to some example embodiments, there is provided an integrated circuit device including a first logic cell defined by a first cell boundary, a second logic cell defined by a second cell boundary spaced apart from the first cell boundary in a first horizontal direction, a fin isolation region extending between the first logic cell and the second logic cell in a second horizontal direction that is perpendicular to the first horizontal direction, a first fin-type active region extending in the first logic cell in the first horizontal direction to the first cell boundary, a second fin-type active region extending in the second logic cell in the first horizontal direction to the second cell boundary, extending in the first horizontal direction and collinear with the first fin-type active region, a fin isolation insulation pattern in the fin isolation region and filling a space between the first fin-type active region and the second fin-type active region, a first gate line extending between the first logic cell and the fin isolation region along the first cell boundary and comprising a first portion covering the first fin-type active region, and a second gate line extending between the second logic cell and the fin isolation region along the second boundary and comprising a second portion covering the second fin-type active region. The first gate line and the second gate line are inclined in the first horizontal direction, the inclination from a lowermost surface of each of the first gate line and the second gate line to an uppermost surface of each of the first gate line and the second gate line and towards a center of the fin isolation region.

BRIEF DESCRIPTION OF THE DRAWINGS

Some example embodiments of inventive concepts will be more clearly understood from the following detailed description taken in conjunction with the accompanying drawings in which:

FIGS. 3A through 3D are cross-sectional views illustrating an integrated circuit device according to some example embodiments, wherein FIG. 3A is a cross-sectional view of some components on a cross-section cut along line X1-X1' of FIG. 2, FIG. 3B is a cross-sectional view of some components on a cross-section cut along line Y1-Y1' of FIG. 2, FIG. 3C is a cross-sectional view of some components on a cross-section cut along line Y2-Y2' of FIG. 2, and FIG. 3D is a cross-sectional view of some components on a cross-section cut along line Y3-Y3' of FIG. 2.

FIGS. 6A through 11C are cross-sectional views illustrating a method of manufacturing an integrated circuit device, according to some example embodiments, in a process order, wherein FIGS. 6A, 7A, 8A, 9A, 10A, and 11A are cross-sectional views of portions corresponding to line X1-X1' of FIG. 2 in a process order, FIGS. 6C, 7C, 8C, 9C, 10C, and 11C are cross-sectional views of portions corresponding to line Y2-Y2' of FIG. 1 in a process order; and FIGS. 12A through 16B are cross-sectional views illustrating a method of manufacturing an integrated circuit device, according to other embodiments, in a process order, wherein FIGS. 12A, 13A, 14A, 15A, and 16A are cross-sectional views of portions corresponding to line X21-X21' of FIG. 4 in a process order, and FIGS. 12B, 13B, 14B, 15B, and 16B are cross-sectional views of portions corresponding to line Y21-Y21' of FIG. 4 in a process order.

DETAILED DESCRIPTION OF SOME EXAMPLE EMBODIMENTS

Figure 1:
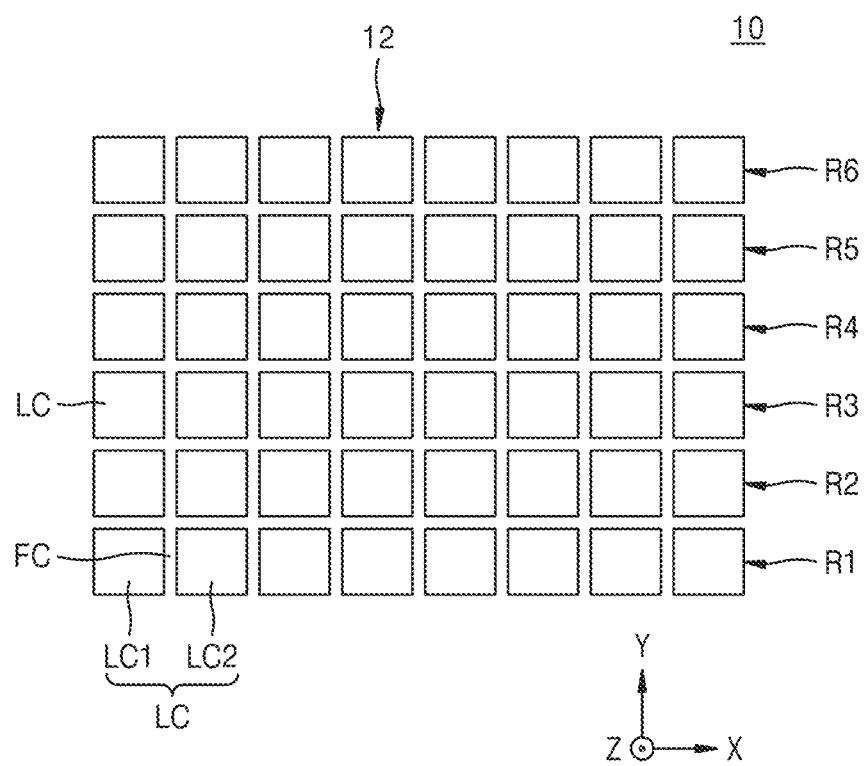
FIG. 1 is a diagram illustrating a planar layout of a cell block of an integrated circuit device, according to some example embodiments.

Hereinafter, some example embodiments of inventive concepts will be described in detail with reference to the attached drawings. In the drawings, like elements will be labeled with like reference numerals, and repeated description thereof will be omitted.

FIG. 1 is a diagram illustrating a planar layout of a cell block 12 of an integrated circuit device 10, according to some example embodiments.

Referring to FIG. 1, the cell block 12 of the integrated circuit device 10 may include a plurality of logic cells LC including circuit patterns to configure various circuits. The plurality of logic cells LC may be arranged in a matrix arranged in a first horizontal direction (X-direction) and a second horizontal direction (Y-direction). In FIG. 1, the first horizontal direction (X-direction) may be referred to as a width direction, and the second horizontal direction (Y-direction) may be referred to as a height direction. In a plan view, a shape of each of the plurality of logic cells LC may be rectangular, e.g. may be square; however, example embodiments are not limited thereto. In the plan view, each of the plurality of logic cells LC may be similar to each other and/or congruent to each other; however, example embodiments are not limited thereto.

The plurality of logic cells LC may include circuits to perform at least one logic function. The plurality of logic cells LC may have a function of performing various logic functions. In some example embodiments, the plurality of logic cells LC may include a plurality of standard cells. In some example embodiments, at least some of the plurality of logic cells LC may perform an identical logic function. In some other embodiments, at least some of the plurality of logic cells LC may perform different logic functions from each other.

The plurality of logic cells LC may include various types of logic cells including a plurality of circuit elements. For example, the plurality of logic cells LC may each include one or more of an AND, a NAND, an OR, a NOR, an exclusive OR (XOR), an exclusive NOR (XNOR), an inverter (INV), an adder (ADD), a buffer (BUF), a delay (DLY), an filter (FIL), a multiplexer (MXT/MXIT), an OR/AND/INVERTER (OAI), an AND/OR (AO), an AND/OR/INVERTER (AOI), a D-flipflop, a reset flipflop, a master-slave flip-flop, a latch, or a combination thereof, but are not limited thereto.

The cell block 12 may include a plurality of rows R1, R2, . . . , and R6 including the plurality of logic cells LC. In a row selected from among the plurality of rows R1, R2, . . . , and R6, for example, in a row R1, at least some of the plurality of logic cells LC arranged in series in the first horizontal direction (X-direction) may have an equal width to each other. Also, each of the plurality of logic cells LC forming one row may have an equal height. However, inventive concepts is not limited to FIG. 1, and at least some of the plurality of logic cells LC forming a row may have different widths and heights from each other. Two neighboring logic cells LC in the width direction from among the plurality of logic cells LC forming a row may be spaced apart from each other with a fin isolation region FC.

The plurality of logic cells LC may include a first logic cell LC1 and a second logic cell LC2 that are adjacent to each other in one row R1 selected from the plurality of rows R1, R2, . . . , and R6. In some example embodiments, the first logic cell LC1 and the second logic cell LC2 may perform an identical function. In some example embodiments, the first logic cell LC1 and the second logic cell LC2 may perform different functions from each other.

While the cell block 12 including six rows R1, R2, . . . , and R6 is illustrated in FIG. 1, this is merely an example, and the cell block 12 may include a various number of rows, selected according to necessity or desire, and a row may include a various number of logic cells, selected according to necessity or desire.

Figure 2:
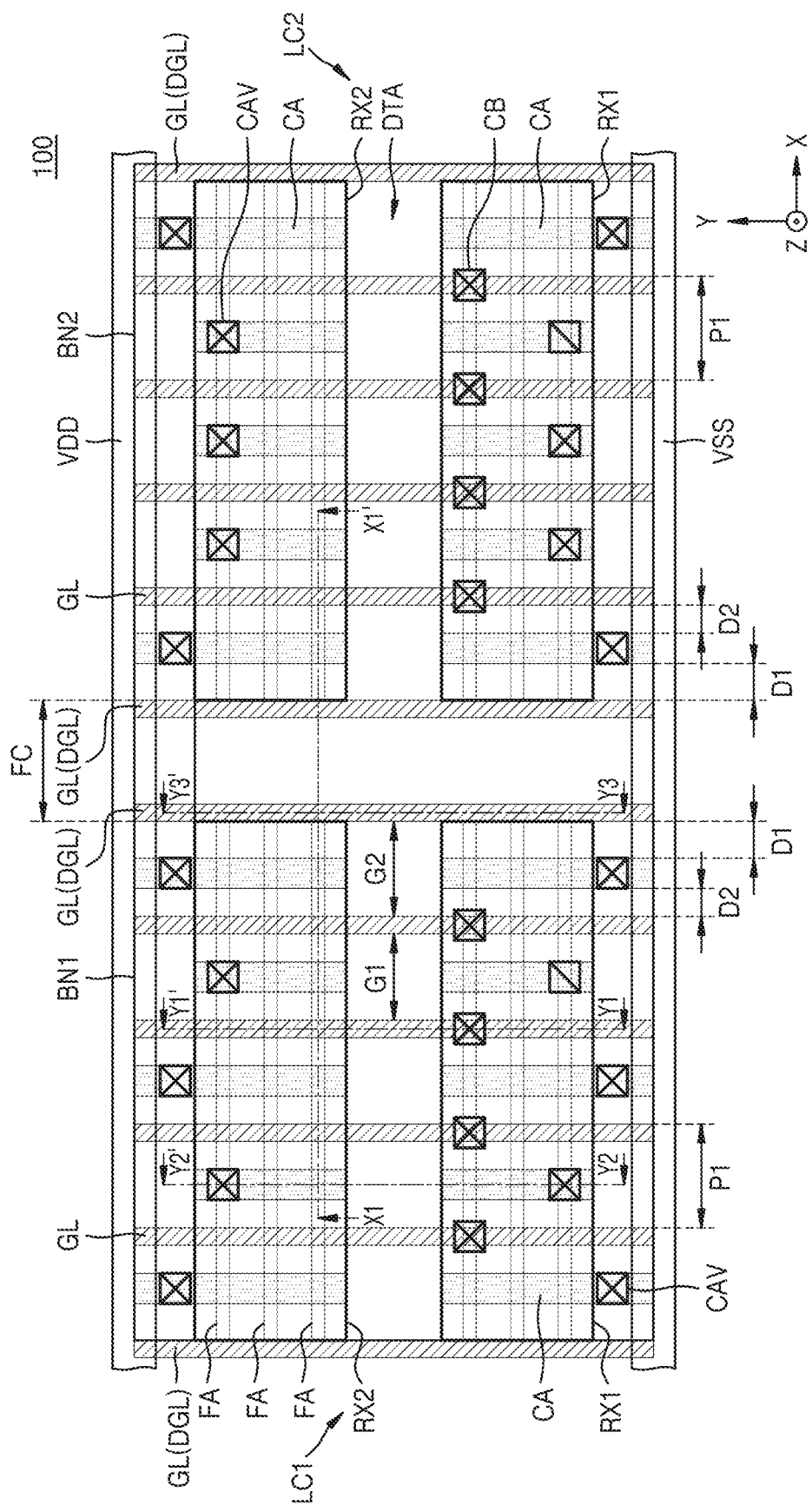
FIG. 2 is a planar layout diagram for describing an integrated circuit device according to some example embodiments.
Figure 3A:
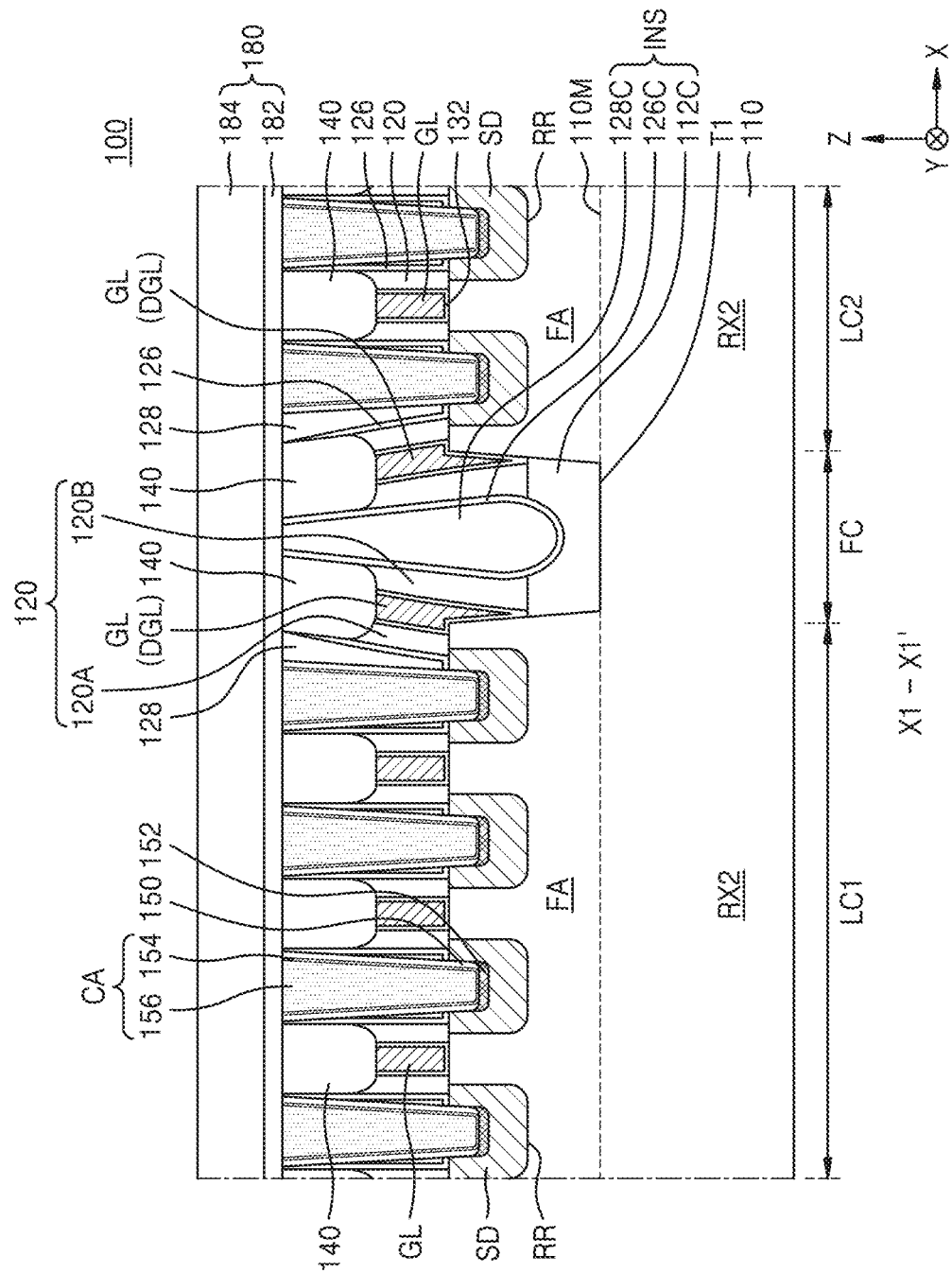
Figure 3B:
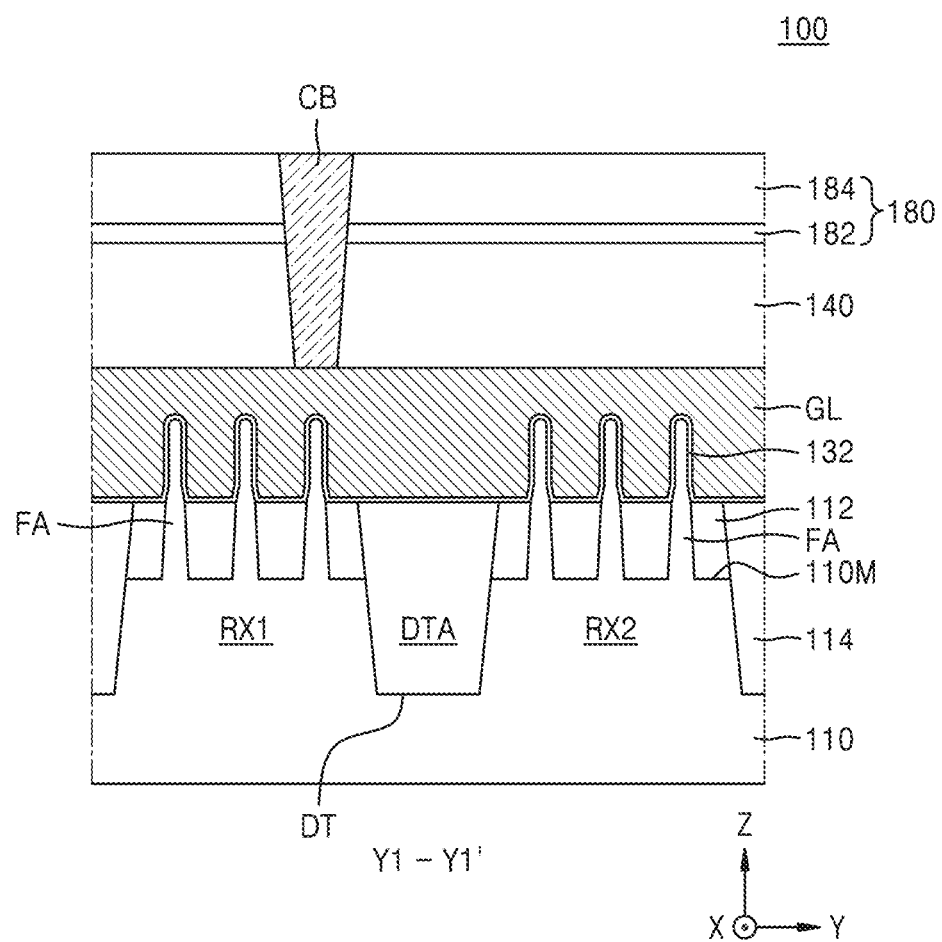
Figure 3C:
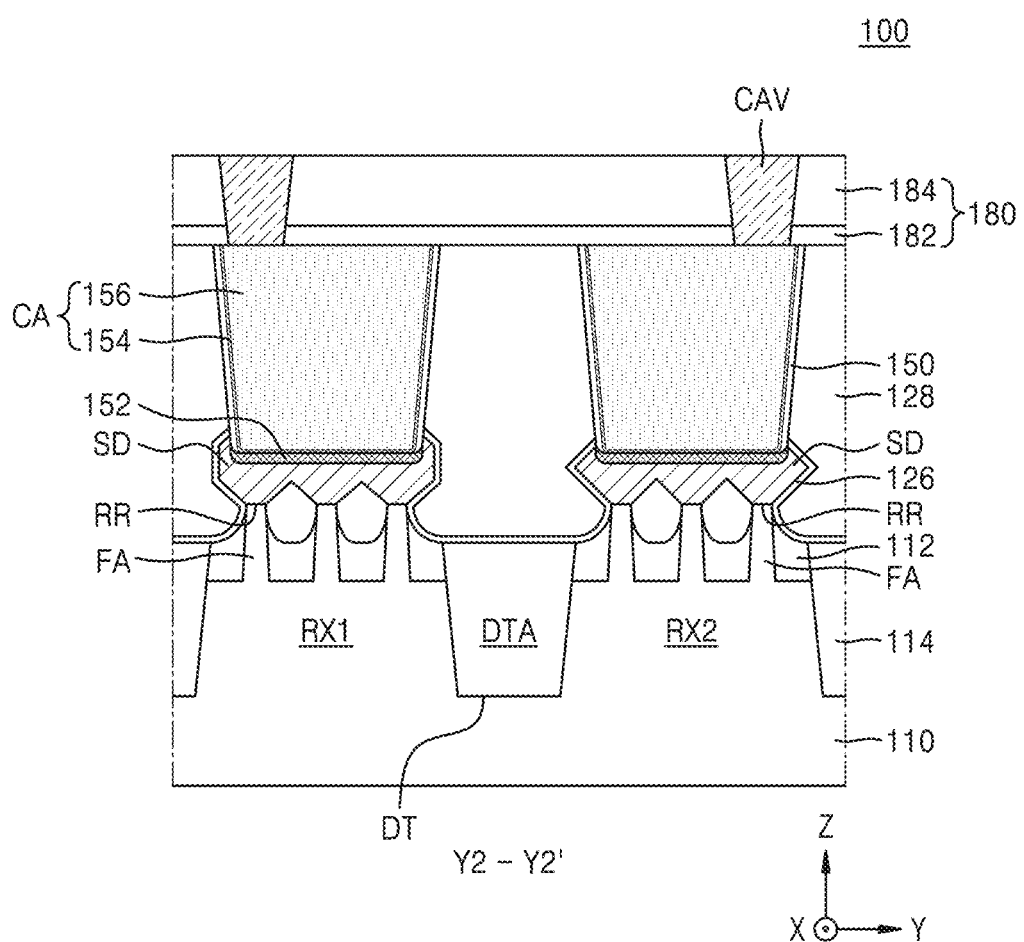
Figure 3D:
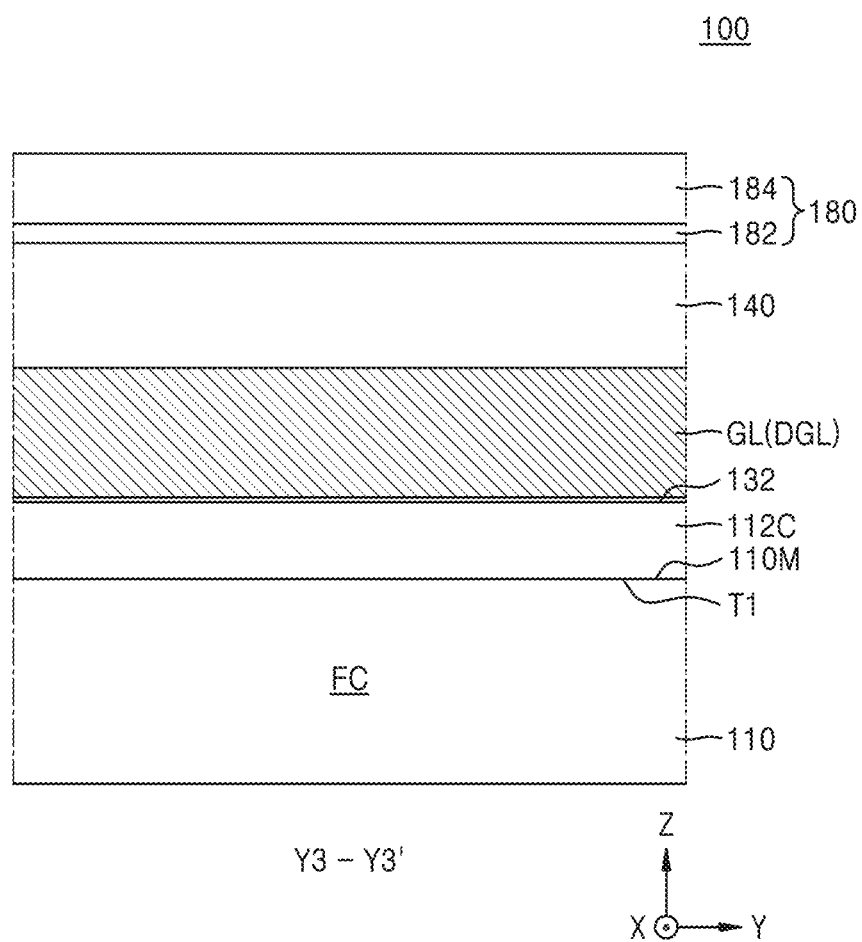

FIG. 2 is a planar layout diagram for describing an integrated circuit device 100 according to some example embodiments. FIGS. 3A through 3D are cross-sectional views illustrating the integrated circuit device 100 according to some example embodiments, wherein FIG. 3A is a cross-sectional view of some components on a cross-section cut along line X1-X1' of FIG. 2, FIG. 3B is a cross-sectional view of some components on a cross-section cut along line Y1-Y1' of FIG. 2, FIG. 3C is a cross-sectional view of some components on a cross-section cut along line Y2-Y2' of FIG. 2, FIG. 3D is a cross-sectional view of some components on a cross-section cut along line Y3-Y3' of FIG. 2.

Referring to FIGS. 2 and 3A through 3D, the integrated circuit device 100 may constitute or correspond to a portion of the integrated circuit device 10 illustrated in FIG. 1. The integrated circuit device 100 may constitute or correspond to a logic cell including a fin field-effect transistor (fin-FET) device.

The integrated circuit device 100 may include the first logic cell LC1 and the second logic cell LC2, on a substrate 110. The first logic cell LC1 may be defined by a first cell boundary BN1, and the second logic cell LC2 may be defined by a second cell boundary BN2. The first logic cell LC1 and the second logic cell LC2 may be spaced apart from each other in the first horizontal direction (X-direction) with the fin isolation region FC between the first logic cell LC1 and the second logic cell LC2.

The substrate 110 may have a main surface 110M extending in a horizontal direction (X-Y plane direction). The substrate 110 may include a semiconductor such as Si or Ge, or a compound semiconductor such as SiGe, SiC, GaAs, InAs, or InP, and may be single-crystalline; however, example embodiments are not limited thereto. The substrate 110 may include a conductive region, for example, an impurity-doped well and/or an impurity-doped structure.

Each of the first logic cell LC1 and the second logic cell LC2 may include a first device region RX1 and a second device region RX2. A plurality of fin-type active regions FA protruding from the substrate 110 may be formed in each of the first device region RX1 and the second device region RX2. An inter-device isolation region DTA may be arranged between the first device region RX1 and the second device region RX2. The plurality of fin-type active regions FA may extend in parallel to each other in the first horizontal direction (X-direction) within the first cell boundary BN1 and the second cell boundary BN2 of the first logic cell LC1 and the second logic cell LC2, respectively.

A trench T1 may be formed in the fin isolation region FC of the substrate 110, and the trench T1 may be filled with a fin isolation insulation structure INS. A length of the plurality of fin-type active regions FA in the first horizontal direction (X-direction) may be defined by the trench T1.

The fin isolation region FC may extend between the first logic cell LC1 and the second logic cell LC2 in the second horizontal direction (Y-direction). The fin isolation insulation structure INS arranged in the fin isolation region FC may include a stack structure including a plurality of insulation layers. The fin isolation insulation structure INS may extend between the first logic cell LC1 and the second logic cell LC2 in the second horizontal direction (Y-direction).

The plurality of fin-type active regions FA in the first logic cell LC1 may extend to the first cell boundary BN1 in the first horizontal direction (X-direction), and the plurality of fin-type active regions FA in the second logic cell LC2 may extend to the second cell boundary BN2 in the first horizontal direction (X-direction). The plurality of fin-type active regions FA in the first logic cell LC1 and the plurality of fin-type active regions FA in the second logic cell LC2 may be spaced apart from each other with the fin isolation insulation structure INS between the plurality of fin-type active regions FA, in the first horizontal direction (X-direction).

As illustrated in FIGS. 3B and 3C, a device isolation layer 112 may be arranged between each of the plurality of fin-type active regions FA on the substrate 110, and an inter-device isolation insulation layer 114 may be arranged on the substrate 110 in the inter-device isolation region DTA. As illustrated in FIGS. 3A and 3D, a fin isolation insulation pattern 112C constituting/corresponding to a portion of the fin isolation insulation structure INS may be arranged in the fin isolation region FC. The fin isolation insulation pattern 112C may fill a space between the fin-type active region FA in the first logic cell LC1 and the fin-type active region FA in the second logic cell LC2. The device isolation layer 112 and the fin isolation insulation pattern 112C may include a same material. The device isolation layer 112 and the fin isolation insulation pattern 112C may be the same material. In some example embodiments, each of the device isolation layer 112, the fin isolation insulation pattern 112C, and the inter-device isolation insulation layer 114 may include an oxide layer, and may or may not include any other material.

The plurality of fin-type active regions FA in the first logic cell LC1 and the second logic cell LC2 may include a pair of fin-type active regions FA spaced apart from each other in the first horizontal direction (X-direction) with the fin isolation insulation pattern 112C in the fin isolation region FC between the pair of fin-type active regions FA. The pair of fin-type active regions FA may extend in a straight line in the first horizontal direction (X-direction).

The plurality of fin-type active regions FA in the first device region RX1 and the second device region RX2 of each of the first logic cell LC1 and the second logic cell LC2 may protrude from the device isolation layer 112 in a fin shape.

In each of the first logic cell LC1 and the second logic cell LC2, a plurality of gate insulation layers 132 and a plurality of gate lines GL may extend on the substrate 110 in the second horizontal direction (Y-direction), which is a direction transverse to the plurality of fin-type active regions FA. The plurality of gate insulation layers 132 and the plurality of gate lines GL may cover an upper surface of each of the plurality of fin-type active regions FA and both sidewalls thereof (of the plurality of fin-type active regions) in the second horizontal direction (Y direction), and may cover an upper surface of each of the device isolation layer 112 and the inter-device isolation insulation layer 114.

The plurality of gate lines GL included in each of the first logic cell LC1 and the second logic cell LC2 may include a plurality of dummy gate lines DGL arranged on an outermost portion of each of the first logic cell LC1 and the second logic cell LC2. The plurality of dummy gate lines DGL may include a dummy gate line DGL extending in the second horizontal direction (Y-direction) along the first cell boundary BN1 of the first logic cell LC1 and a dummy gate line DGL extending in the second horizontal direction (Y-direction) along the second cell boundary BN2 of the second logic cell LC2. The plurality of dummy gate lines DGL may maintain an electrically floating state during operation of the integrated circuit device 100, and may function as an electrically isolated region with respect to other logic cells in their surroundings in each of the first logic cell LC1 and the second logic cell LC2. For example, the plurality of dummy gate lines DGL may not be electrically active during operation of the integrated circuit device 100; however, example embodiments are not limited thereto.

In the first device region RX1 and the second device region RX2 of each of the first logic cell LC1 and the second logic cell LC2, a plurality of metal oxide semiconductor (MOS) transistors may be formed along the plurality of gate lines GL. Each of the plurality of MOS transistors may be or correspond to a MOS transistor having a three-dimensional structure in which channels are formed on an upper surface and both sidewalls of the plurality of fin-type active regions FA.

As illustrated in FIG. 2, in each of the first logic cell LC1 and the second logic cell LC2, among the plurality of gate lines GL except for the plurality of dummy gate lines DGL, gate lines GL (hereinafter, the above gate lines GL may be referred to as inner gate lines GL) may have a same width in the first horizontal direction (X-direction) and may be arranged at a constant pitch P1 in the first horizontal direction (X-direction). A first gap G1 between two adjacent inner gate lines GL from among the plurality of inner gate lines GL among the plurality of gate lines GL except for the plurality of dummy gate lines DGL may be uniform.

As illustrated in FIG. 3A, a dummy gate line DGL, which is an outermost gate line GL closest to the fin isolation region FC among the plurality of gate lines GL, may have a shape inclined to be closer to a center of the fin isolation region FC in the first horizontal direction (X-direction), and may be inclined from a lowermost surface to an uppermost surface thereof. For example, there may be an acute angle between a top surface of the fin isolation insulation pattern 112C and a sidewall of the dummy gate line DGL. Thus, a gap between a pair of inner gate lines GL that are selected from among the plurality of inner gate lines GL and are adjacent to each other in the first horizontal direction (X-direction) may be different from a gap between the dummy gate line DGL and an inner gate line GL that is most adjacent to the dummy gate line DGL.

As illustrated in FIG. 2, in each of the first logic cell LC1 and the second logic cell LC2, an upper surface of one inner gate line GL that is most adjacent to the dummy gate line DGL may be spaced apart by the first gap G1 in the first horizontal direction (X-direction) from an upper surface of another inner gate line GL that is most adjacent to the one inner gate line GL and spaced apart from the dummy gate line DGL with the one inner gate line GL therebetween, and the upper surface of the one inner gate line GL and an upper surface of the dummy gate line DGL may be spaced apart from each other in the first horizontal direction (X-direction) by a second gap G2 that is greater than the first gap G1.

As illustrated in FIG. 3A, a dummy gate line DGL arranged between the first logic cell LC1 and the fin isolation region FC may extend along the first cell boundary BN1, and may include a first portion facing a fin upper surface of the fin-type active region FA included in the first logic cell LC1 within the first cell boundary BN1 of the first logic cell LC1 and a second portion that is located in the fin isolation region FC beyond the first cell boundary BN1 of the first logic cell LC1 and is closer to the second logic cell LC2 than the first portion is. The second portion may cover sidewalls of the fin-type active regions FA included in the first logic cell LC1, the sidewalls facing the fin isolation region FC.

As illustrated in FIG. 3A, a dummy gate line DGL arranged between the second logic cell LC2 and the fin isolation region FC may extend along the second cell boundary BN2, and may include a third portion facing a fin upper surface of the fin-type active region FA included in the second logic cell LC2 within the second cell boundary BN2 of the second logic cell LC2 and a fourth portion that is located in the fin isolation region FC beyond the second cell boundary BN2 of the second logic cell LC2 and is closer to the first logic cell LC1 than the third portion is. The fourth portion may cover sidewalls of the fin-type active region FA included in the second logic cell LC2, the sidewalls facing the fin isolation region FC.

The plurality of gate insulation layers 132 may include a silicon oxide layer, a high-k layer, or a combination thereof. The high-k layer may include a material having a higher dielectric constant than that of the silicon oxide layer. The high-k layer may include a metal oxide and/or a metal oxynitride. An interface layer (not shown) may be between the fin-type active region FA and the gate insulation layer 132. The interface layer may include at least one of an oxide layer, a nitride layer, or an oxynitride layer.

Among the plurality of gate lines GL, the plurality of inner gate lines GL and the plurality of dummy gate lines DGL may include a same material, e.g. may be of the same material. Each of the plurality of gate lines GL may have a structure in which a metal nitride layer, a metal layer, a conductive capping layer, and a gap-fill metal layer are sequentially stacked. The metal nitride layer and the metal layer may include at least one metal selected from Ti, Ta, W, Ru, Nb, Mo, and Hf. The gap-fill metal layer may include a W layer and/or an Al layer. Each of the plurality of gate lines GL may include a work function metal-containing layer. The work function metal-containing layer may include at least one metal selected from Ti, W, Ru, Nb, Mo, Hf, Ni, Co, Pt, Yb, Tb, Dy, Er, and Pd. In some example embodiments, the plurality of gate lines GL may include a stacked structure of TiAlC/TiN/W, a stacked structure of TiN/TaN/TiAlC/TiN/W, or a stacked structure of TiN/TaN/TiN/TiAlC/TiN/W, but are not limited to the above examples.

A plurality of insulation spacers 120 may cover both sidewalls of each of the plurality of gate lines GL. The plurality of insulation spacers 120 may extend in the second horizontal direction (Y-direction), which is a length direction of the first logic cell LC1 and the second logic cell LC2. The plurality of insulation spacers 120 may include a silicon nitride layer, a SiOCN layer, a SiCN layer, or a combination thereof, but is not limited thereto.

As illustrated in FIG. 3A, the plurality of insulation spacers 120 may include a first insulation spacer 120A and a second insulation spacer 120B covering both sidewalls of the dummy gate line DGL. The first insulation spacer 120A may be arranged to overlap with the fin-type active region FA outside the fin isolation region FC in a vertical direction (Z-direction), and the second insulation spacer 120B may be arranged to overlap with the fin isolation region FC in the vertical direction (Z-direction). A lowermost surface of the first insulation spacer 120A may be in contact with the fin upper surface of the fin-type active region FA. The second insulation spacer 120B may be in contact with an upper surface of the fin isolation insulation pattern 112C included in the fin isolation insulation structure INS.

As illustrated in FIG. 3A, the fin isolation insulation structure INS may further include a fin isolation insulation liner 126C and a fin isolation gap-fill insulation layer 128C that are sequentially stacked on the fin isolation insulation pattern 112C. The fin isolation insulation liner 126C may cover the upper surface of the fin isolation insulation pattern 112C and the sidewalls of the dummy gate line DGL. The fin isolation gap-fill insulation layer 128C may be arranged between a pair of dummy gate lines DGL that are adjacent to each other, with the fin isolation region FC between the pair of dummy gate lines DGL, and may fill an upper space of the fin isolation region FC on the fin isolation insulation liner 126C. A lowermost surface of the fin isolation insulation liner 126C and a lowermost surface of the fin isolation gap-fill insulation layer 128C may (e.g. may both) be lower than (e.g. lower than both of) the upper surface of the fin isolation insulation pattern 112C and lower than a lowermost surface of the gate line GL.

The fin isolation insulation pattern 112C and the fin isolation insulation liner 126C may include different insulation materials from each other. The fin isolation insulation pattern 112C and the fin isolation gap-fill insulation layer 128C may include different materials from each other. In some example embodiments, each of the fin isolation insulation pattern 112C and the fin isolation gap-fill insulation layer 128C may include a silicon oxide layer and may not include a silicon nitride layer, and the fin isolation insulation liner 126C may include a silicon nitride layer and may not include a silicon oxide layer.

Upper surfaces of the plurality of gate lines GL, the plurality of gate insulation layers 132, and the plurality of insulation spacers 120 may be respectively covered by insulation capping lines 140. The plurality of insulation capping lines 140 may include a silicon nitride layer.

A plurality of recess regions RR may be formed on both sides of each of the gate lines GL on the upper surface of the plurality of fin-type active regions FA, and a plurality of source/drain regions SD may be formed in the plurality of recess regions RR. The gate lines GL and the source/drain regions SD may be spaced apart from each other with the gate insulation layers 132 and the insulation spacers 120 therebetween, e.g. between the gate lines GL and the source/drain regions SD. The plurality of source/drain regions SD may include a semiconductor epitaxial layer epitaxially grown (e.g. homogenously epitaxial grown or heterogeneously epitaxial grown) from the plurality of recess regions RR formed in the fin-type active region FA, or a combination thereof. The plurality of source/drain regions SD may include an epitaxially grown Si layer, an epitaxially grown SiC layer, and/or a plurality of epitaxially grown SiGe layers. In the first device region RX1, the plurality of source/drain regions SD may include an epitaxially grown Si layer, and in the second device region RX2, the plurality of source/drain regions SD may include an epitaxially grown SiGe layer; however, example embodiments are not limited thereto.

The plurality of source/drain regions SD may be covered by an insulation liner 126. A space between each of the plurality of gate lines GL on the insulation liner 126 may be filled with an inter-gate insulation layer 128. The insulation liner 126 may conformally cover a surface of each of the plurality of source/drain regions SD. In some example embodiments, the insulation liner 126 may include SiN, SiCN, SiBN, SiON, SiOCN, SiBCN, SiOC, $SiO_2$, or a combination thereof. The inter-gate insulation layer 128 may include a silicon oxide layer.

The insulation liner 126 and the fin isolation insulation liner 126C may include, e.g. may be of, a same material. The inter-gate insulation layer 128 and the fin isolation gap-fill insulation layer 128C may include a same material.

In some example embodiments, the first device region RX1 may be or correspond to an NMOS transistor region, and the second device region RX2 may be or correspond to a PMOS transistor region. In this case, the plurality of source/drain regions SD in the first device region RX1 may include an epitaxially grown Si layer and/or an epitaxially grown SiC layer, and the plurality of source/drain regions SD in the second device region RX2 may include a plurality of epitaxially grown SiGe layer. As illustrated in FIG. 3C, the plurality of source/drain regions SD in the first device region RX1 and the plurality of source/drain regions SD in the second device region RX2 may have different shapes and sizes from each other, for example associated with different epitaxial processes. However, inventive concepts is not limited to the example shown in FIG. 3C, and a plurality of source/drain regions SD having various shapes and sizes may be formed in the first device region RX1 and the second device region RX2.

As illustrated in FIGS. 3A and 3C, a plurality of source/drain contacts CA may be formed on the plurality of source/drain regions SD. The plurality of source/drain regions SD may be connected to a conductive line (not shown) above, through the plurality of source/drain contacts CA. The plurality of source/drain contacts CA may include a conductive barrier layer 154 and a metal plug 156. The conductive barrier layer 154 may surround sidewalls and a bottom surface of the metal plug 156. The conductive barrier layer 154 may include Ti, Ta, TiN, TaN, or a combination thereof, and the metal plug 156 may include Co, Cu, Ru, Mn, or a combination thereof, but are not limited thereto.

A metal silicide layer 152 may be between the source/drain regions SD and the source/drain contacts CA. In some example embodiments, the metal silicide layer 152 may include at least one of Ti, W, Ru, Nb, Mo, Hf, Ni, Co, Pt, Yb, Tb, Dy, Er, or Pd. For example, the metal silicide layer 152 may include titanium silicide.

Sidewalls of each of the plurality of source/drain contacts CA may be covered by a contact insulation spacer 150. In some example embodiments, the contact insulation spacer 150 may include SiCN, SiCON, silicon nitride (SiN), or a combination thereof, but is not limited thereto.

As illustrated in FIGS. 2 and 3A, in the first horizontal direction (X-direction), the source/contact CA may be between the dummy gate line DGL and the inner gate line GL that is most adjacent to the dummy gate line DGL. Here, as illustrated in FIG. 2, a first distance D1 between the upper surface of the dummy gate line DGL and the source/drain contact CA may be greater than a second distance D2 between the upper surface of the inner gate line GL and the source/drain contact CA. Accordingly, a sufficient insulation distance may be provided between the source/drain contact CA and the dummy gate line DGL adjacent to the source/drain contact CA.

The integrated circuit device 100 may include an insulation structure 180 covering an upper surface of each of the plurality of source/drain contacts CA and an upper surface of the insulation capping lines 140. The insulation structure 180 may include an etch stop layer 182 and an interlayer insulation layer 184 sequentially stacked on the plurality of source/drain contacts CA. The etch stop layer 182 may include silicon carbide (SiC), SiN, nitrogen-doped silicon carbide (SiC:N), SiOC, AlN, AlON, AlO, AlOC, or a combination thereof. The interlayer insulation layer 184 may include an oxide layer, a nitride layer, an ultra low-k (ULK) layer having an ultra low dielectric constant K of between about 2.2 to about 2.4, or a combination thereof. For example, the interlayer insulation layer 184 may include a tetraethylorthosilicate (TEOS) layer, a high density plasma (HDP) layer, a boro-phosphosilicate glass (BPSG) layer, a flowable chemical vapor deposition (FCVD) oxide layer, a SiON layer, a SiN layer, a SiOC layer, a SiCOH layer, or a combination thereof.

As illustrated in FIGS. 2 and 3C, a plurality of via contacts CAV may be formed on the plurality of source/drain contacts CA. The plurality of via contacts CAV may pass through the insulation structure 180 and contact the upper surfaces of the source/drain contacts CA.

As illustrated in FIGS. 2 and 3B, a plurality of gate contacts CB may be formed on the plurality of gate lines GL. Each of the plurality of gate contacts CB may pass through the insulation structure 180 and the insulation capping line 140 to be connected to the upper surfaces of the gate lines GL.

The plurality of via contacts CAV and the plurality of gate contacts CB may include a buried metal layer and a conductive barrier layer surrounding the buried metal layer. The buried metal layer may include Co, Cu, W, Ru, Mn, or a combination thereof, and the conductive barrier layer may include Ti, Ta, TiN, TaN, or a combination thereof, but are not limited thereto. Sidewalls of each of the plurality of via contacts CAV and the plurality of gate contacts CB may be covered by an insulation liner (not shown). The insulation liner may include a silicon nitride layer, but is not limited thereto.

As illustrated in FIG. 2, in the first logic cell LC1 and the second logic cell LC2, a ground line VSS may be connected to the fin-type active region FA in the first device region RX1 through some of the plurality of source/drain contacts CA, and a power line VDD may be connected to the fin-type active region FA in the second logic cell LC2 via some other source/drain contacts CA from among the plurality of source/drain contacts CA. The ground line VSS and the power line VDD may be formed at a higher level than the upper surface of each of the plurality of source/drain contacts CA and the plurality of gate contacts CB. The ground line VSS and the power line VDD may each include a conductive barrier layer and a conductive layer for wirings. The conductive barrier layer may include Ti, Ta, TiN, TaN, or a combination thereof. The conductive layer for wirings may include Co, Cu, W, an alloy thereof, or a combination thereof.

In the integrated circuit device 100 illustrated in FIGS. 1 and 3A through 3D, a sufficient insulation distance may be provided between the dummy gate line DGL adjacent to the fin isolation region FC and the source/drain contact CA adjacent to the dummy gate line DGL. Accordingly, in the integrated circuit device 100 having an area reduced according to downscaling, a sufficient insulation distance between conductive regions may be more likely to be secured, and/or unwanted parasitic capacitance may be reduced in the integrated circuit device 100, thereby improving the reliability of the integrated circuit device 100.

Figure 4:
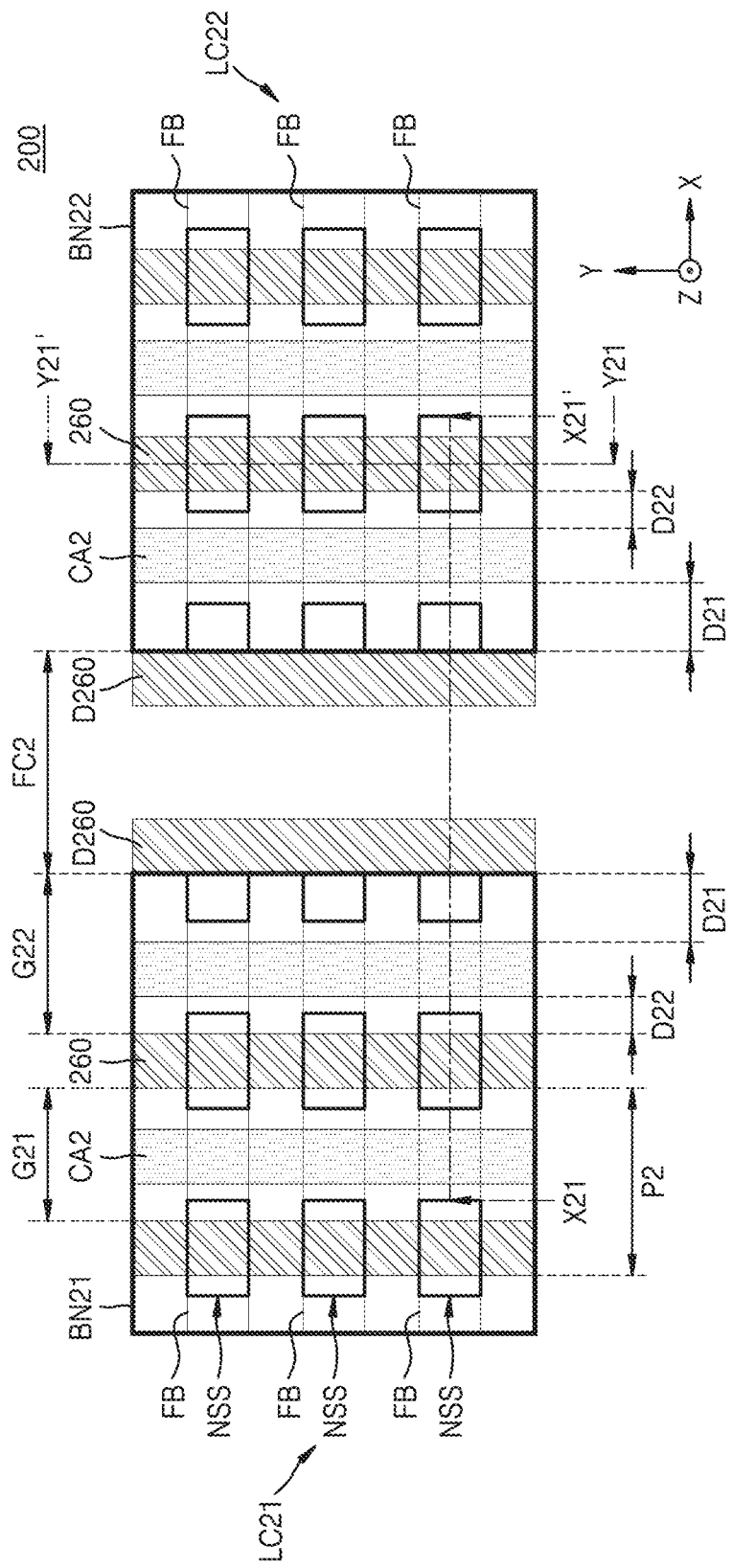
FIG. 4 is a planar layout diagram illustrating some components of an integrated circuit device according to some example embodiments.
Figure 5A:
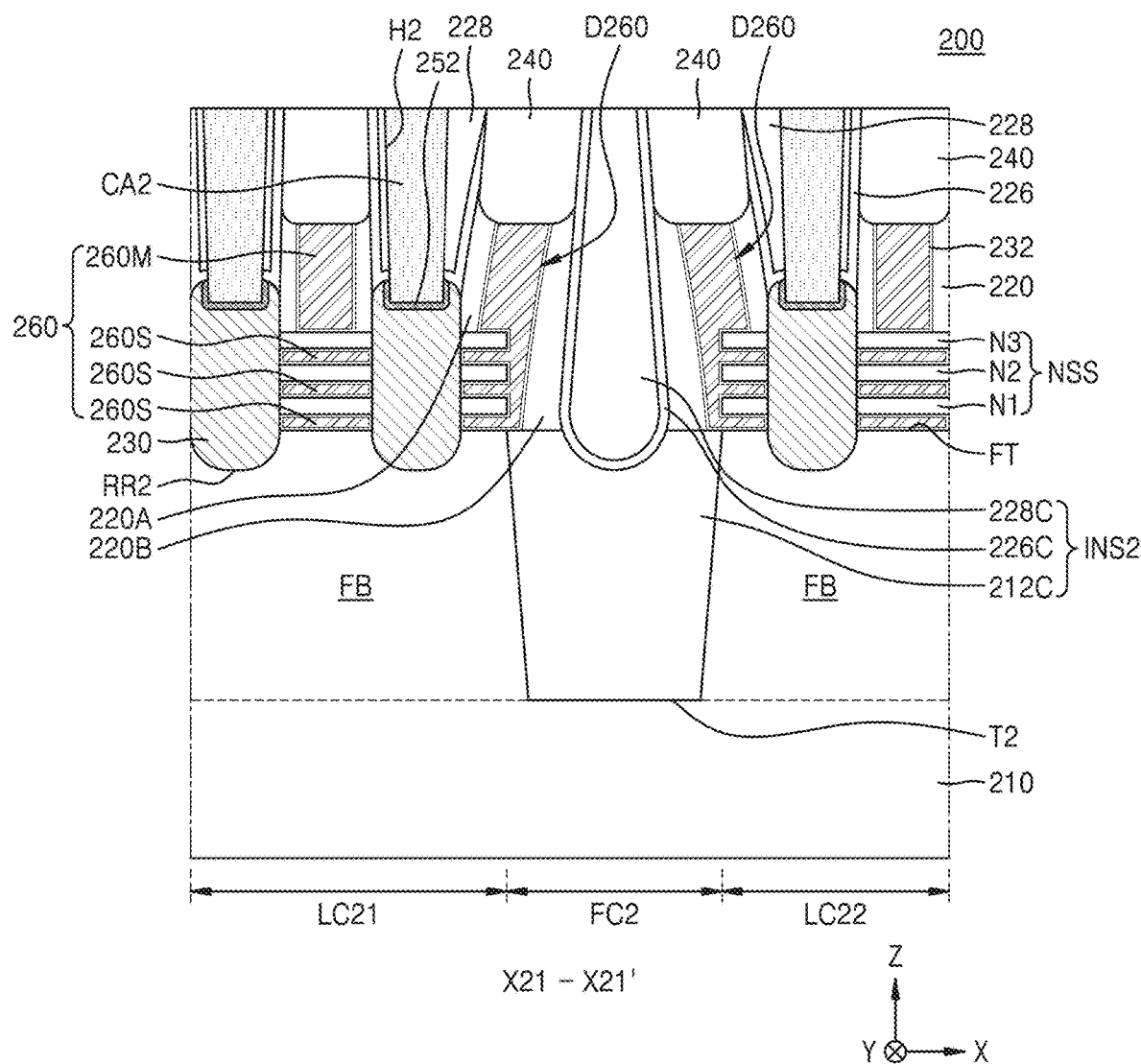
FIG. 5A is a cross-sectional view cut along line X21-X21' of FIG. 4.
Figure 5B:
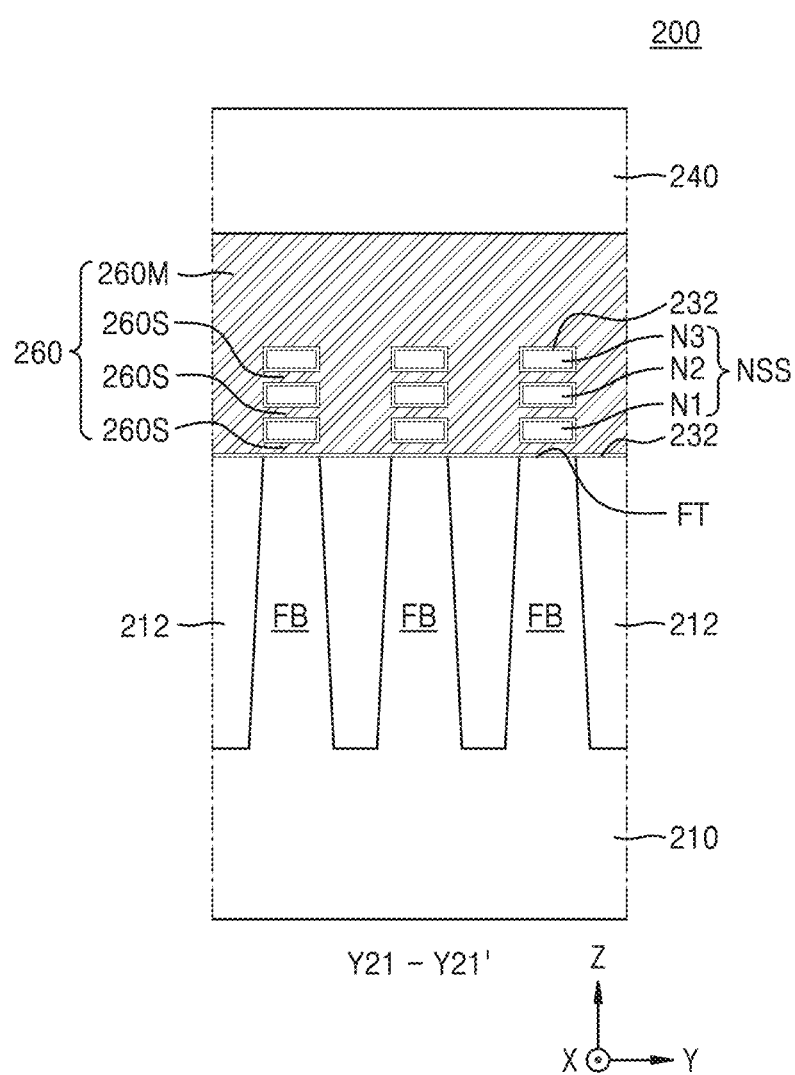
FIG. 5B is a cross-sectional view cut along line Y21-Y21' of FIG. 4.

FIG. 4 is a planar layout diagram of some components of an integrated circuit device 200 according to some example embodiments, and FIG. 5A is a cross-sectional view cut along line X21-X21' of FIG. 4, and FIG. 5B is a cross-sectional view cut along line Y21-Y21' of FIG. 4.

Referring to FIGS. 4, 5A, and 5B, the integrated circuit device 200 may include a plurality of fin-type active regions FB protruding from a substrate 210 and extending in the first horizontal direction (X-direction) and a plurality of nanosheet stacks NSS facing a fin upper surface FT of the plurality of fin-type active regions FB at a position apart from the plurality of fin-type active regions FB in a vertical direction (Z-direction). The integrated circuit device 200 may include multi-bridge channel field-effect transistors (MBCFET's™). Herein, the term "nanosheet" refers to a conductive structure having a cross-section substantially perpendicular to a direction in which current flows. It should be understood that the nanosheet includes nanowires. The substrate 210 may have substantially the same configuration as that described with respect to the substrate 110 with reference to FIGS. 3A through 3D.

The integrated circuit device 200 may include a first logic cell LC21 and a second logic cell LC22 on the substrate 210. The first logic cell LC21 may be defined by a first cell boundary BN21, and the second logic cell LC22 may be defined by a second cell boundary BN22. The first logic cell LC21 and the second logic cell LC22 may be spaced apart from each other in the first horizontal direction (X-direction) with a fin isolation region FC2 therebetween, between the first logic cell LC21 and the second logic cell LC22.

A trench T2 may be formed in/within the fin isolation region FC2 of the substrate 210, and the trench T2 may be filled with a fin isolation insulation structure INS2. A length of the plurality of fin-type active regions FB in the first horizontal direction (X-direction) may be defined by the trench T2.

The fin isolation region FC2 may extend between the first logic cell LC21 and the second logic cell LC22 in the second horizontal direction (Y-direction). The fin isolation insulation structure INS2 arranged in the fin isolation region FC2 may include a stack structure including a plurality of insulation layers. The fin isolation insulation structure INS2 may extend between the first logic cell LC21 and the second logic cell LC22 in the second horizontal direction (Y-direction).

The plurality of fin-type active regions FB in the first logic cell LC21 may extend to the first cell boundary BN21 in the first horizontal direction (X-direction), and the plurality of fin-type active regions FB in the second logic cell LC22 may extend to the second cell boundary BN22 in the first horizontal direction (X-direction). The plurality of fin-type active regions FB in the first logic cell LC21 and the plurality of fin-type active regions FB in the second logic cell LC22 may be spaced apart from each other with the fin isolation insulation structure INS2 between the plurality of fin-type active regions FB, in the first horizontal direction (X-direction).

As illustrated in FIG. 5B, a device isolation layer 212 may be arranged on the substrate 210 between each of the plurality of fin-type active regions FB. As illustrated in FIG. 5A, a fin isolation insulation pattern 212C constituting a portion of the fin isolation insulation structure INS2 may be arranged in the fin isolation region FC2. The fin isolation insulation pattern 212C may fill a space between the fin-type active region FB in the first logic cell LC21 and the fin-type active region FB in the second logic cell LC22. The device isolation layer 212 and the fin isolation insulation pattern 212C may include a same material. The detailed configuration of the device isolation layer 212 and the fin isolation insulation pattern 212C is substantially similar to that of the device isolation layer 112 and the fin isolation insulation pattern 112C described above with reference to FIGS. 3A through 3C.

The plurality of fin-type active regions FB in the first logic cell LC21 and the second logic cell LC22 may each include a pair of fin-type active regions FB spaced apart from each other in the first horizontal direction (X-direction) with the fin isolation insulation pattern 212C in the fin isolation region FC2 between the pair of fin-type active regions FB. The pair of fin-type active regions FB may extend in a straight line in the first horizontal direction (X-direction).

A plurality of gate lines 260 may extend on the plurality of fin-type active regions FB in the second horizontal direction (Y-direction) in each of the first logic cell LC21 and the second logic cell LC22. The plurality of nanosheet stacks NSS may be arranged on the fin upper surface FT of each of the plurality of fin-type active regions FB in regions where the plurality of fin-type active regions FB intersect with the plurality of gate lines 260, and may face the fin upper surface FT of the fin-type active region FB at a position apart from the fin-type active region FB. A plurality of nanosheet transistors may be formed in portions where the plurality of fin-type active regions FB intersect with the plurality of gate lines 260 on the substrate 210.

The plurality of nanosheet stacks NSS may include a plurality of nanosheets N1, N2, and N3 mutually overlapping each other in the vertical direction (Z-direction) on the fin upper surface FT of each fin-type active region FB. The plurality of nanosheets N1, N2, and N3 may include a first nanosheet N1, a second nanosheet N2, and a third nanosheet N3 having different vertical distances from the fin upper surface FT of the fin-active region FB. Each of the plurality of nanosheets N1, N2, and N3 may have a channel region. In some example embodiments, each of the plurality of nanosheets N1, N2, and N3 may include a Si layer, a SiGe layer, or a combination thereof, and may include the same or different materials.

FIG. 4 illustrates the nanosheet stacks NSS having a substantially rectangular planar shape, but inventive concepts is not limited thereto. The nanosheet stacks NSS may have various planar shapes according to a planar shape of each of the fin-type active regions FB and the gate lines 260. In the present example, a configuration is shown, in which the plurality of nanosheet stacks NSS and the plurality of gate lines 260 are formed on one fin-type active region FB, and the plurality of nanosheet stacks NSS are arranged on one fin-type active region FB in a line in the first horizontal direction (X-direction). However, according to inventive concepts, the number of nanosheet stacks NSS arranged on one fin-type active region FB is not particularly limited. For example, one nanosheet stack NSS may be formed on one fin-type active region FB. In some example embodiments, the plurality of nanosheet stacks NSS each including three nanosheets are described, but inventive concepts is not limited thereto. For example, a nanosheet stack NSS may include at least two nanosheets, and the number of nanosheets of the nanosheet stack NSS is not particularly limited.

In the integrated circuit device 200, the plurality of gate lines 260 included in each of the first logic cell LC21 and the second logic cell LC22 may include a plurality of dummy gate lines D260 arranged in an outermost portion of each of the first logic cell LC21 and the second logic cell LC22. The plurality of dummy gate lines D260 may include a dummy gate line D260 extending in the second horizontal direction (Y-direction) along the first cell boundary BN21 of the first logic cell LC21 and a dummy gate line D260 extending in the second horizontal direction (Y-direction) along the second cell boundary BN22 of the second logic cell LC22. The plurality of dummy gate lines D260 may maintain an electrically floating state during operation of the integrated circuit device 200, and may function as an electrically isolated region with respect to other logic cells in their surroundings in each of the first logic cell LC21 and the second logic cell LC22.

In each of the first logic cell LC21 and the second logic cell LC22, among the plurality of gate lines 260 except for the plurality of dummy gate lines D260, gate lines 260 (hereinafter, the above gate lines 260 may be referred to as inner gate lines 260) may have a same width in the first horizontal direction (X-direction) and may be arranged at a constant pitch P2 in the first horizontal direction (X-direction). A first gap G21 between two adjacent inner gate lines 260 from among the plurality of gate lines 260 except for the plurality of dummy gate lines D260 among the plurality of gate lines 260 may be uniform.

As illustrated in FIG. 5A, the dummy gate line D260, which is an outermost gate line 260 closest to the fin isolation region FC2 among the plurality of gate lines 260, may have a shape inclined to be closer to a center of the fin isolation region FC2 in the first horizontal direction (X-direction) from a lowermost surface to an uppermost surface thereof. Thus, a gap between a pair of inner gate lines 260 that are selected from among the plurality of inner gate lines 260 and adjacent to each other in the first horizontal direction (X-direction) may be different from a gap between the dummy gate line D260 and an inner gate line 260 that is most adjacent to the dummy gate line D260.

As illustrated in FIG. 4, in each of the first logic cell LC21 and the second logic cell LC22, an upper surface of one inner gate line 260 that is most adjacent to the dummy gate line D260 may be spaced apart from an upper surface of another inner gate line 260 that is most adjacent to the one inner gate line 260 and spaced apart from the dummy gate line D260 with the one inner gate line 260 therebetween, in the first horizontal direction (X-direction) by the first gap G21, and the upper surface of the one inner gate line 260 and an upper surface of the dummy gate line D260 may be spaced apart from each other in the first horizontal direction (X-direction) by a second gap G22 that is greater than the first gap G21.

As illustrated in FIG. 5A, the dummy gate line D260 arranged between the first logic cell LC21 and the fin isolation region FC2 may extend along the first cell boundary BN21, and may include a first portion facing the fin upper surface FT of the fin-type active region FB included in the first logic cell LC21 within the first cell boundary BN21 of the first logic cell LC21 and a second portion that is located in the fin isolation region FC2 beyond the first cell boundary BN21 of the first logic cell LC21 and is closer to the second logic cell LC22 than the first portion is. The second portion may cover sidewalls of the fin-type active region FB included in the first logic cell LC21, the sidewalls facing the fin isolation region FC2.

As illustrated in FIG. 5A, a dummy gate line D260 arranged between the second logic cell LC22 and the fin isolation region FC2 may extend along the second cell boundary BN22, and may include a third portion facing the fin upper surface FT of the fin-type active region FB included in the second logic cell LC22 within the second cell boundary BN22 of the second logic cell LC22 and a fourth portion that is located in the fin isolation region FC2 beyond the second cell boundary BN22 of the second logic cell LC22 and closer to the first logic cell LC21 than the third portion is. The fourth portion may cover sidewalls of the fin-type active region FB included in the second logic cell LC22, the sidewalls facing the fin isolation region FC2.

Among the plurality of gate lines 260, the plurality of inner gate lines 260 and the plurality of dummy gate lines D260 may include a same material. A detailed configuration of the plurality of gate lines 260 is substantially the same as that described with respect to the plurality of gate lines GL described with reference to FIGS. 2 and 3A through 3D.

A plurality of recess regions RR2 may be formed in upper portions of the fin-type active region FB, and a plurality of source/drain regions 230 may be formed in the plurality of recess regions RR2. The plurality of source/drain regions 230 may include an epitaxially grown semiconductor layer. A detailed configuration of the plurality of source/drain regions 230 is substantially the same as that described with respect to the source/drain regions SD illustrated in FIGS. 3A and 3C.

The gate lines 260 may surround each of the plurality of nanosheets N1, N2, and N3 while covering the nanosheet stacks NSS on the fin-type active regions FB. Each of the plurality of gate lines 260 may include a main gate portion 260M covering an upper surface of the nanosheet stack NSS and extending in the second horizontal direction (Y-direction) and a plurality of sub-gate portions 260S respectively arranged between each of the plurality of nanosheets N1, N2, and N3 and between the fin-type active region FB and the first nanosheet Ni. The plurality of nanosheets N1, N2, and N3 may have a gate-all-around (GAA) structure surrounded by the gate line 260.

A gate insulation layer 232 may be between the nanosheet stack NSS and the gate line 260. The gate insulation layer 232 may have substantially the same configuration as that described with respect to the gate insulation layer 132 illustrated in FIGS. 2A and 2B.

A metal silicide layer 252 may be formed on an upper surface of each of the plurality of source/drain regions 230. The metal silicide layer 252 may have substantially the same configuration as that described with respect to the metal silicide layer 152 illustrated in FIGS. 5A and 5C. The metal silicide layer 252 may be omitted.

Both sidewalls of each of the plurality of gate lines 260 may be covered by a plurality of insulation spacers 220. The plurality of insulation spacers 220 may cover both sidewalls of the main gate portion 260M on the plurality of nanosheet stacks NSS. The plurality of insulation spacers 220 may extend in the second horizontal direction (Y-direction), which is a length direction of the first logic cell LC21 and the second logic cell LC22.

The plurality of insulation spacers 220 may include a first insulation spacer 220A and a second insulation spacer 220B covering both sidewalls of the dummy gate line D260. The first insulation spacer 220A may be arranged to overlap with the fin-type active region FB outside the fin isolation region FC2 in a vertical direction (Z-direction), and the second insulation spacer 220B may be arranged to overlap with the fin isolation region FC2 in the vertical direction (Z-direction). A lowermost surface of the first insulation spacer 220A may be in contact with the fin upper surface FT of the fin-type active region FB. The second insulation spacer 220B may be in contact with an upper surface of the fin isolation insulation pattern 212C included in the fin isolation insulation structure INS2.

In some example embodiments, an inner insulation spacer (not shown) may be between the source/drain region 230 and the gate insulation layer 232, between each of the plurality of nanosheets N1, N2, and N3 and between the fin-type active region FB and the first nanosheet N1. In this case, both sidewalls of each of the plurality of sub-gate portions 260S may be covered by the inner insulation spacer with the gate insulation layer 232 therebetween.

The plurality of insulation spacers 220 and the plurality of source/drain regions 230 may be covered by an insulation liner 226. The insulation spacer 220 and the insulation liner 226 may have substantially the same configuration as those described with respect to the insulation spacer 120 and the insulation liner 126 with reference to FIGS. 3A and 3C.

As illustrated in FIG. 5A, the fin isolation insulation structure INS2 may further include a fin isolation insulation liner 226C and a fin isolation gap-fill insulation layer 228C sequentially stacked on the fin isolation insulation pattern 212C. The fin isolation insulation liner 226C may cover an upper surface of the fin isolation insulation pattern 212C and the sidewalls of the dummy gate line D260. The fin isolation gap-fill insulation layer 228C may be arranged between a pair of dummy gate lines D260 adjacent to each other, with the fin isolation region FC2 therebetween, and may fill an upper space of the fin isolation region FC2 on the fin isolation insulation liner 226C. A lowermost surface of the fin isolation insulation liner 226C and a lowermost surface of the fin isolation gap-fill insulation layer 228C may be lower than the upper surface of the fin isolation insulation pattern 212C and lower than a lowermost surface of the gate line 260.

The fin isolation insulation pattern 212C and the fin isolation insulation liner 226C may include different insulation materials from each other. The fin isolation insulation pattern 212C and the fin isolation gap-fill insulation layer 228C may include different materials from each other. In some example embodiments, each of the fin isolation insulation pattern 212C and the fin isolation gap-fill insulation layer 228C may include a silicon oxide layer, and the fin isolation insulation liner 226C may include a silicon nitride layer.

Upper surfaces of the plurality of gate lines 260, the plurality of gate insulation layers 232, and the plurality of insulation spacers 220 may be covered by an insulation capping line 240. The insulation capping line 240 may have substantially the same configuration as that described with reference to the insulation capping line 140 illustrated in FIGS. 3A, 3B, and 3D.

The plurality of source/drain regions 230 may be covered by an insulation liner 226. A space between each of the plurality of gate lines 260 on the insulation liner 226 may be filled with an inter-gate insulation layer 228. A detailed configuration of the insulation liner 226 and the inter-gate insulation layer 228 is substantially the same as that described with respect to the insulation liner 126 and the inter-gate insulation layer 128 with reference to FIGS. 3A and 3C.

A plurality of source/drain contacts CA2 may be arranged in a plurality of contact holes H2 penetrating the inter-gate insulation layer 228 and the insulation liner 226. Each of the plurality of source/drain contacts CA2 may be connected to the source/drain region 230 through the metal silicide layer 252. The plurality of source/drain contacts CA2 may have substantially the same configuration as that described with respect to the source/drain contacts CA illustrated in FIGS. 3A and 3C, respectively.

In the integrated circuit device 200 illustrated in FIGS. 4, 5A, and 5B, a sufficient insulation distance may be provided between the dummy gate line D260 adjacent to the fin isolation region FC2 and the source/drain contact CA2 adjacent to the fin isolation region FC2. Accordingly, in the integrated circuit device 200 having an area reduced according to downscaling, a sufficient insulation distance between conductive regions may be secured, and unwanted parasitic capacitance may be reduced in the integrated circuit device 200, thereby improving the reliability of the integrated circuit device 200.

Hereinafter, a method of manufacturing integrated circuit devices according to some example embodiments of inventive concepts will be described based on specific examples.

Figure 6A:
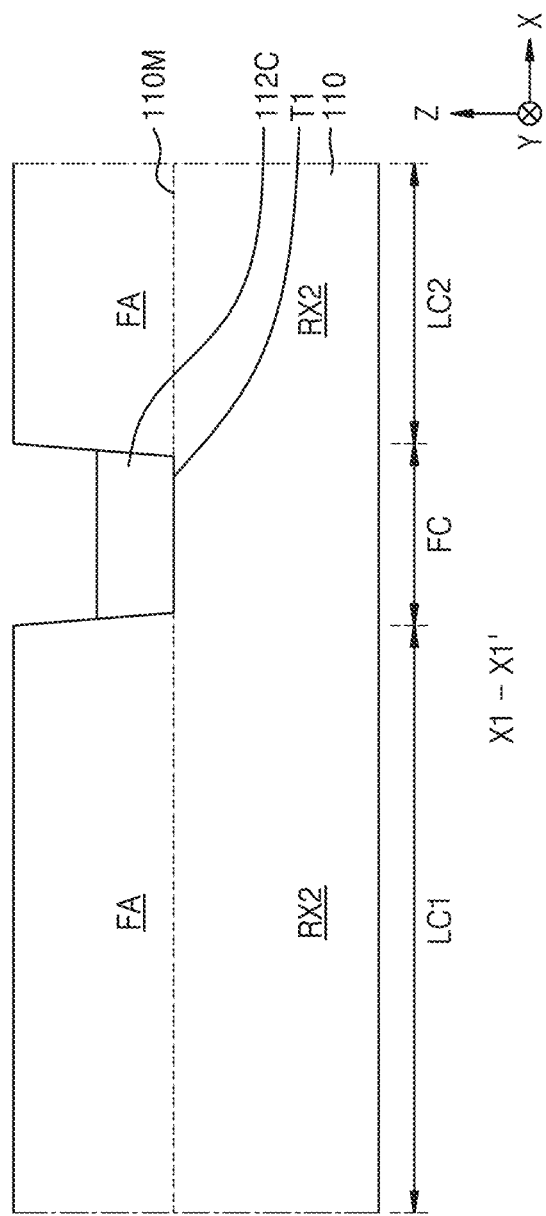
Figure 6B:
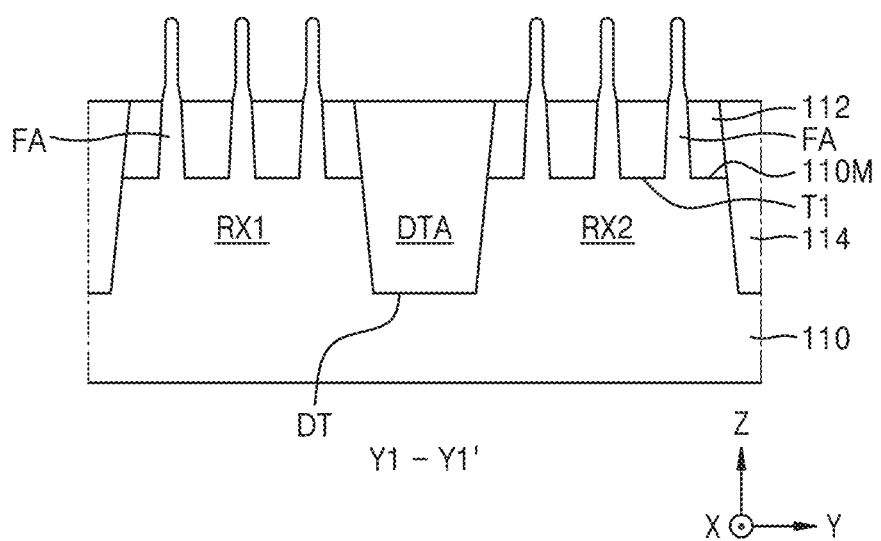
FIGS. 6B, 7B, 8B, 9B, 10B, and 11B are cross-sectional views of portions corresponding to line Y1-Y1' of FIG. 1 in a process order.
Figure 6C:
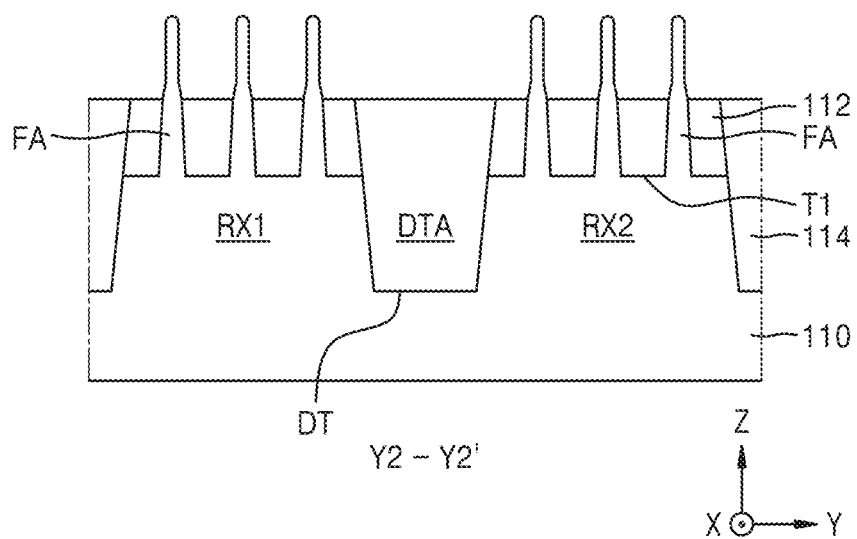
Figure 7A:
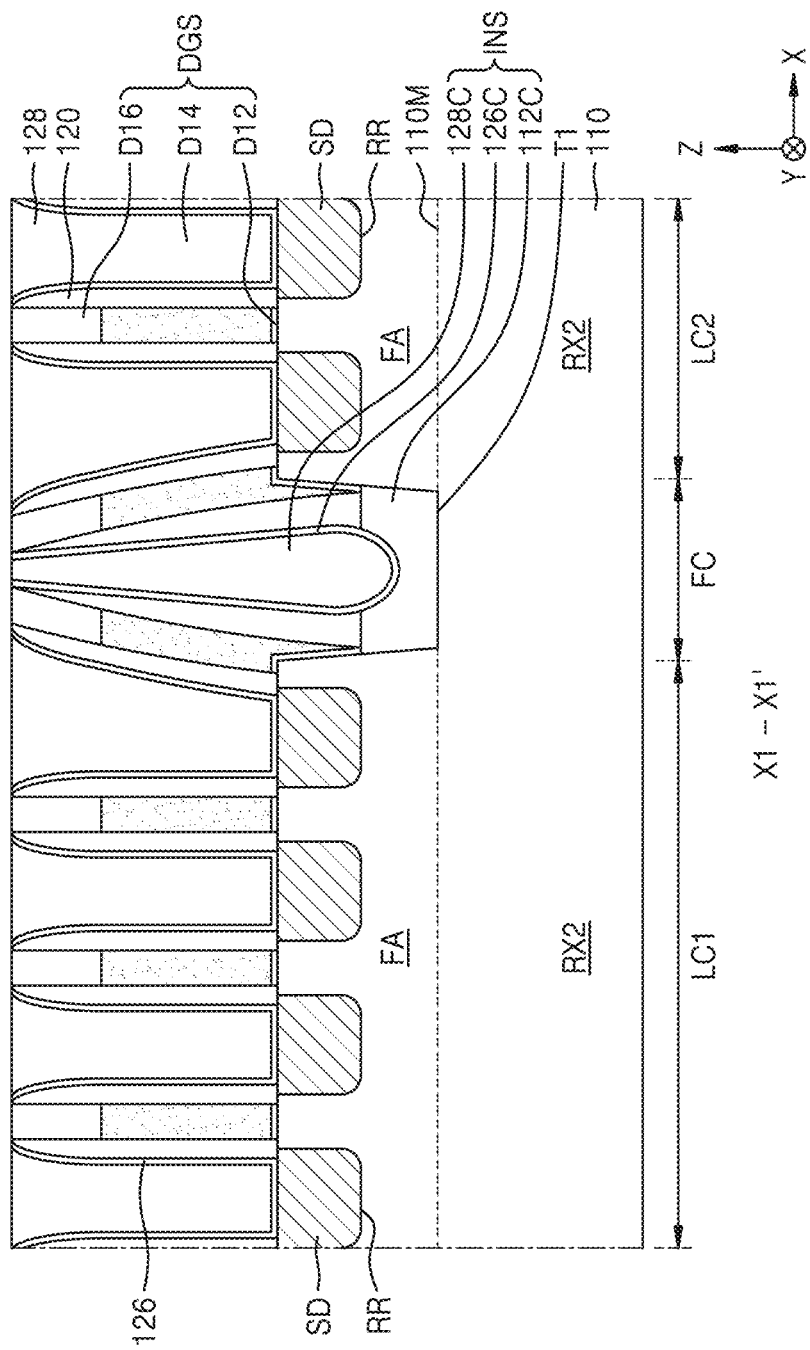
Figure 7B:
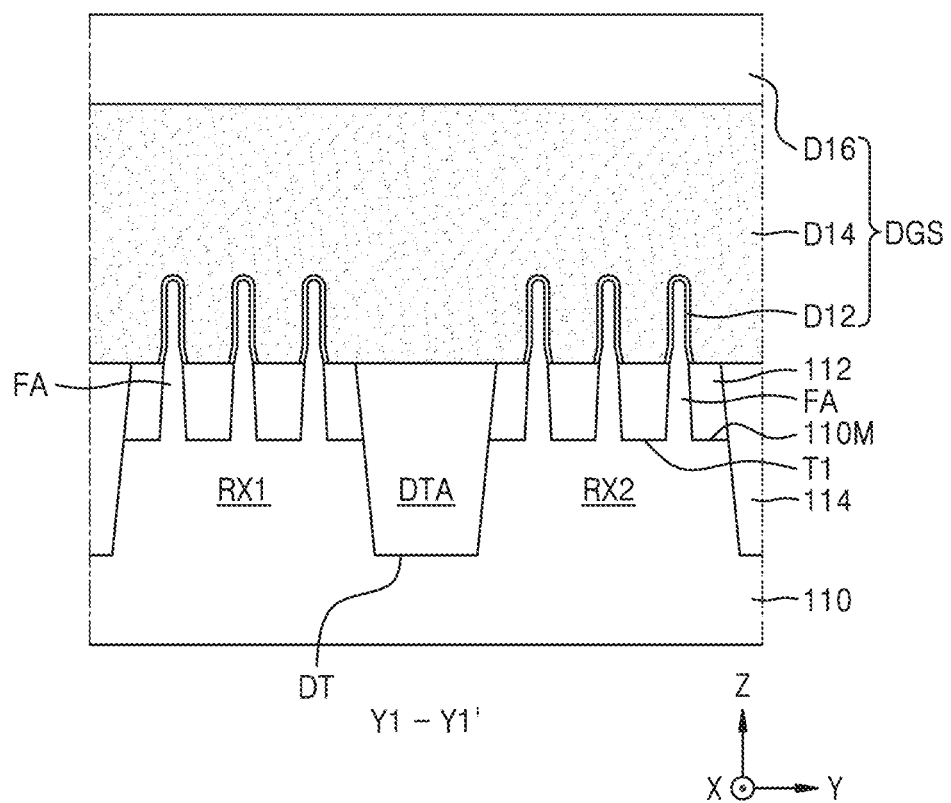
Figure 7C:
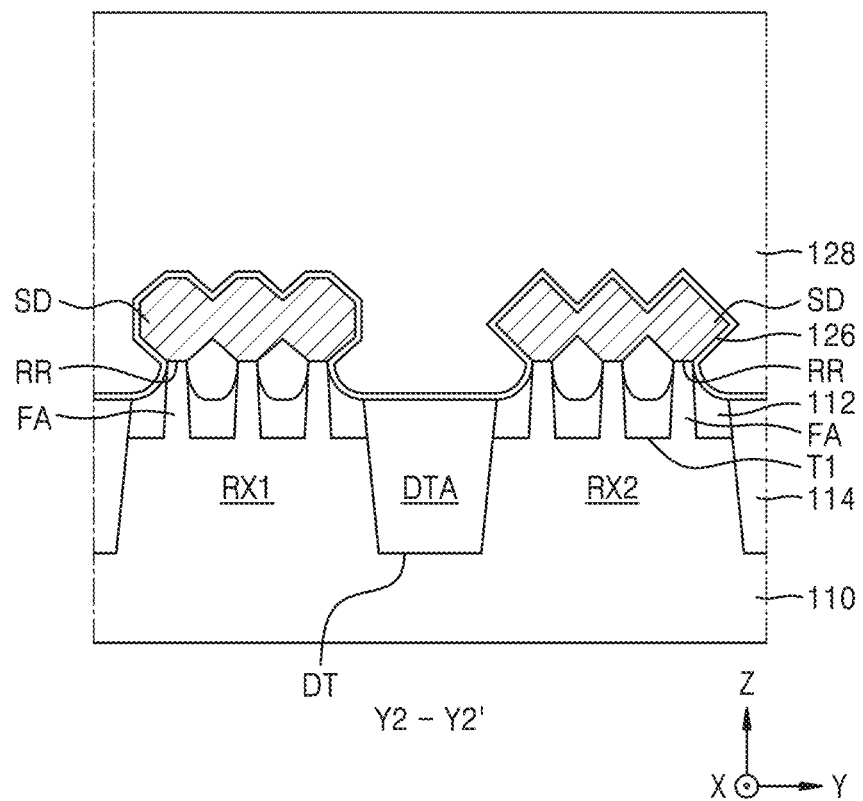

FIGS. 6A through 11C are cross-sectional views illustrating a method of manufacturing an integrated circuit device, according to some example embodiments, in a process order, wherein FIGS. 6A, 7A, . . . , and 11A are cross-sectional views of portions corresponding to line X1-X1' of FIG. 2 in a process order, and FIGS. 6B, 7B, . . . , and 11B are cross-sectional views of portions corresponding to line Y1-Y1' of FIG. 1 in a process order, and FIGS. 6C, 7C, . . . , and 11C are cross-sectional views of portions corresponding to line Y2-Y2' of FIG. 1 in a process order. An example method of manufacturing the integrated circuit device 100 illustrated in FIGS. 2 and 3A through 3D will be described with reference to FIGS. 6A through 11C. In FIGS. 6A through 11C, like reference numerals as those of FIGS. 2 and 3A through 3D denote like elements, and detailed description thereof will be omitted here.

Referring to FIGS. 6A, 6B, and 6C, the trench T1 may be formed in the substrate 110 to form a plurality of fin-type active regions FA protruding from the main surface 110M of the substrate 110 in the vertical direction (Z-direction) and extending in the first horizontal direction (X-direction) in the first device region RX1 and the second device region RX2 of regions in which the first logic cell LC1 and the second logic cell LC2 are to be formed, and the fin isolation region FC may be defined between the first logic cell LC1 and the second logic cell LC2. Next, the device isolation layer 112 covering both lower sidewalls of each of the plurality of fin-type active regions FA and the fin isolation insulation pattern 112C filling a portion of the trench T1 in the fin isolation region FC may be formed. The device isolation layer 112 and the fin isolation insulation pattern 112C may be formed simultaneously.

In the regions in which the first logic cell LC1 and the second logic cell LC2 are to be formed, a portion of the device isolation layer 112 and a portion of the substrate 110 may be etched to form a deep trench DT defining the first device region RX1 and the second device region RX2, and the deep trench DT may be filled with the inter-device isolation insulation layer 114. Next, a recess process may be performed to lower heights of the device isolation layer 112, the fin isolation insulation pattern 112C, and the inter-device isolation insulation layer 114, respectively, such that the plurality of fin-type active regions FA may protrude from an upper surface of the device isolation layer 112 in the first device region RX1 and the second device region RX2.

Referring to FIGS. 7A, 7B, and 7C, a plurality of dummy gate structures DGS crossing the plurality of fin-type active regions FA and extending on the device isolation layer 112 and the inter-device isolation insulation layer 114 may be formed. The plurality of dummy gate structures DGS may include a dummy gate insulation layer D12, a dummy gate line D14, and a dummy insulation capping layer D16 that are sequentially stacked on each of the plurality of fin-type active regions FA. The dummy gate insulation layer D12 may include a silicon oxide. The dummy gate line D14 may include doped or undoped polysilicon. The dummy insulation capping layer D16 may include a silicon nitride.

The insulation spacer 120 covering both sidewalls of each of the plurality of dummy gate structures DGS may be formed, and the recess region RR may be formed on an upper surface of each of the plurality of fin-type active regions FA by etching a portion of the plurality of fin-type active regions FA exposed on both sides of the dummy gate structures DGS. Next, the plurality of source/drain regions SD filling the plurality of recess regions RR may be formed. While forming the insulation spacer 120 and the recess regions RR, a portion of an upper portion of each of the device isolation layer 112 and the fin isolation insulation pattern 112C may be removed.

After forming the plurality of source/drain regions SD, a resultant product including the plurality of source/drain regions SD may be annealed, e.g. annealed with a rapid thermal annealing process and/or a laser annealing process and/or a furnace process such as a low pressure annealing process. Here, due to stresses, e.g. thermal stresses such as tensile and/or compressive thermal stresses affecting the regions in which the first logic cell LC1 and the second logic cell LC2 are to be formed and each fin isolation region FC, a dummy gate structure DGS adjacent to the fin isolation region FC from among the plurality of dummy gate structures DGS may be inclined toward the fin isolation region FC. Accordingly, the dummy gate structure DGS may have a shape inclined to be closer to a center of the fin isolation region FC in the first horizontal direction (X-direction) from a lowermost surface to an uppermost surface thereof.

Next, the insulation liner 126 covering exposed surfaces of each of the dummy gate structure DGS, the insulation spacer 120, the device isolation layer 112, the inter-device isolation insulation layer 114, and the source/drain regions SD, and the fin isolation insulation liner 126C covering an exposed surface of the fin isolation insulation pattern 112C in the fin isolation region FC may be formed. The insulation liner 126 and the fin isolation liner 126C may be formed simultaneously.

Next, the inter-gate insulation layer 128 may be formed on the insulation liner 126, and the fin isolation gap-fill insulation layer 128C may be formed on the fin isolation insulation liner 126C. The inter-gate insulation layer 128 and the fin isolation gap-fill insulation layer 128C may be formed simultaneously.

Figure 8A:
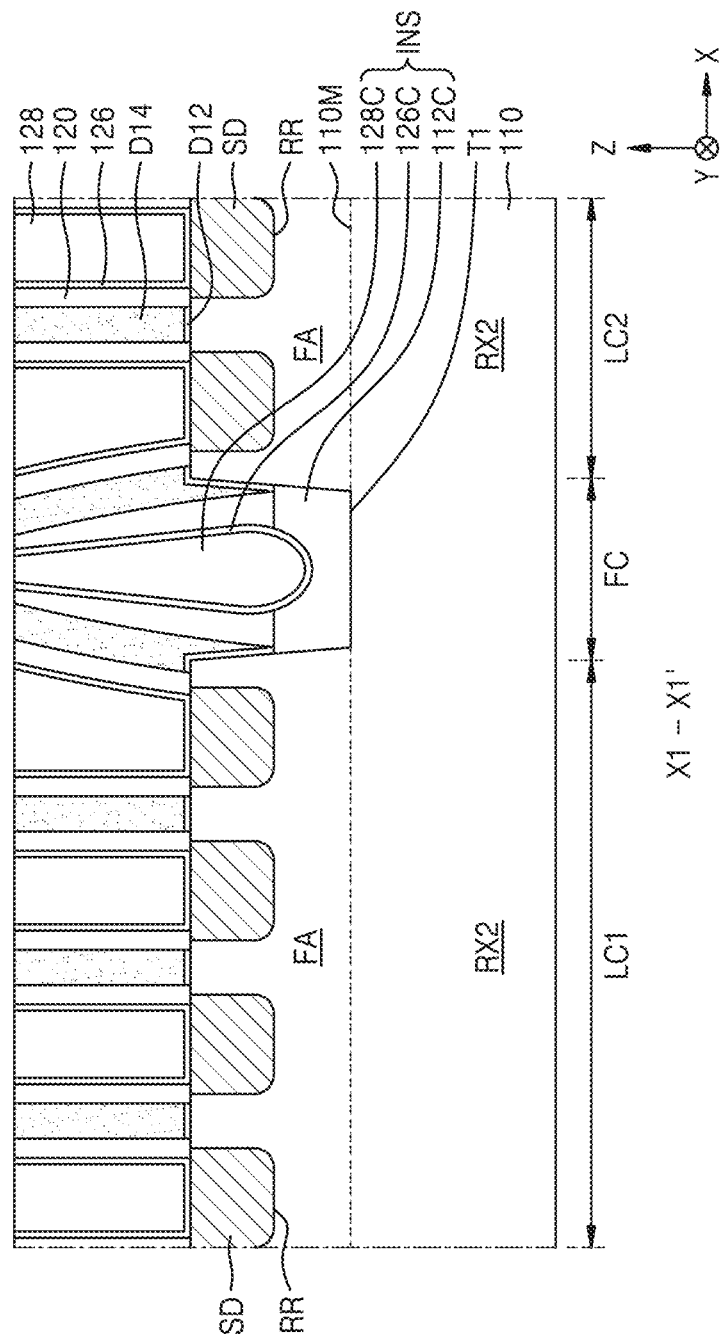
Figure 8B:
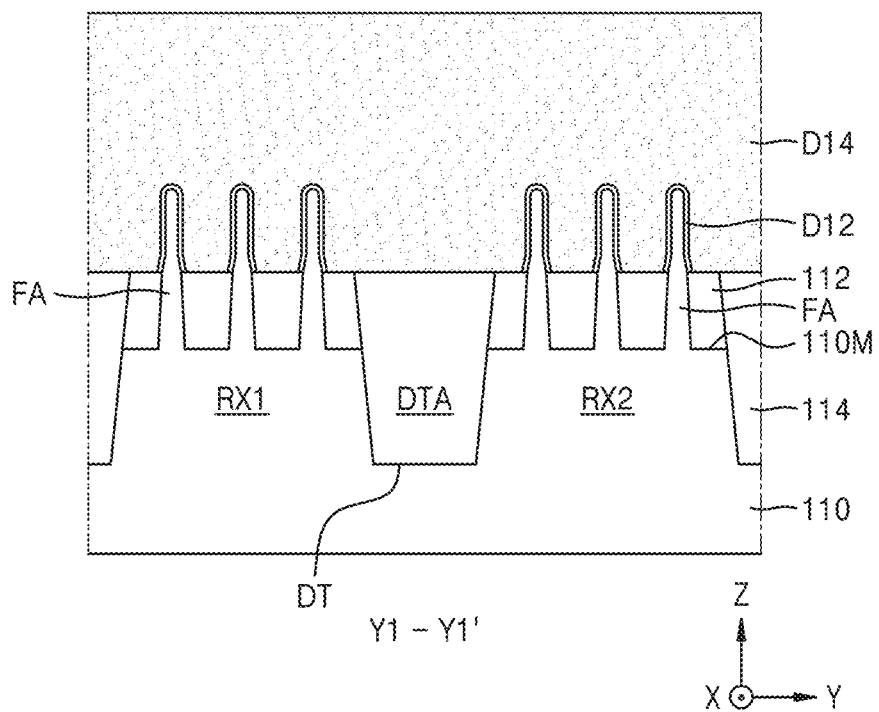
Figure 8C:
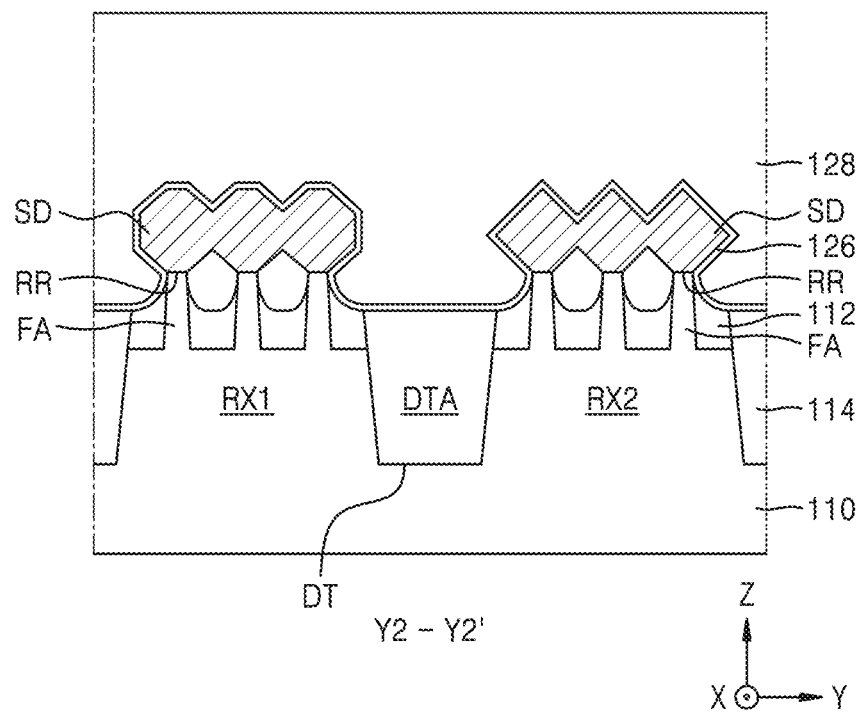

Referring to FIGS. 8A, 8B, and 8C, on a resultant product of FIGS. 7A, 7B, and 7C, the dummy insulation capping layer D16 and the insulation layers therearound may be removed using a chemical mechanical polishing (CMP) process and/or an etch-back process to expose the dummy gate line D14. Here, heights of the insulation liner 126, the fin isolation insulation liner 126C, the inter-gate insulation layer 128, the fin isolation gap-fill insulation layer 128C, and the plurality of insulation spacers 120 may be lowered.

Figure 9A:
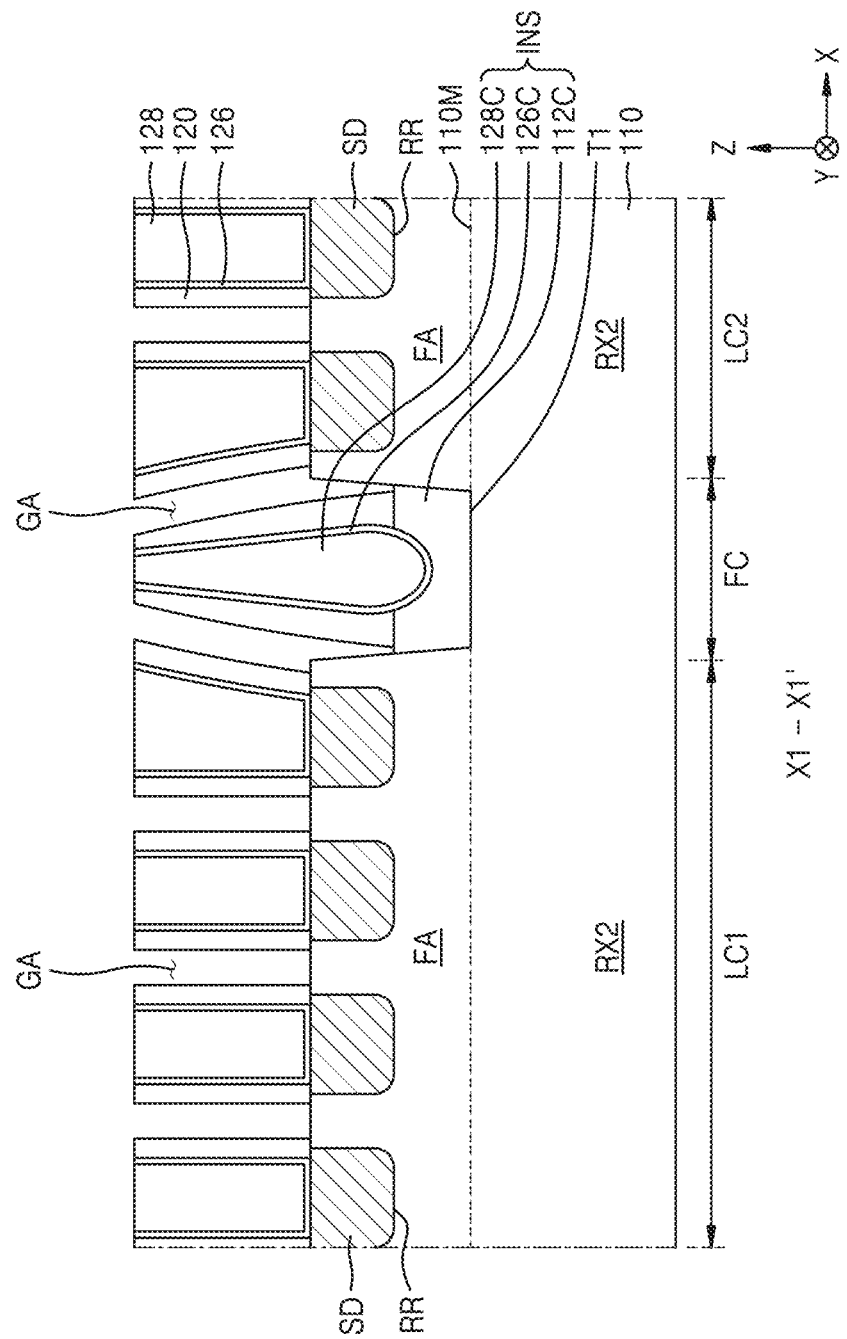
Figure 9B:
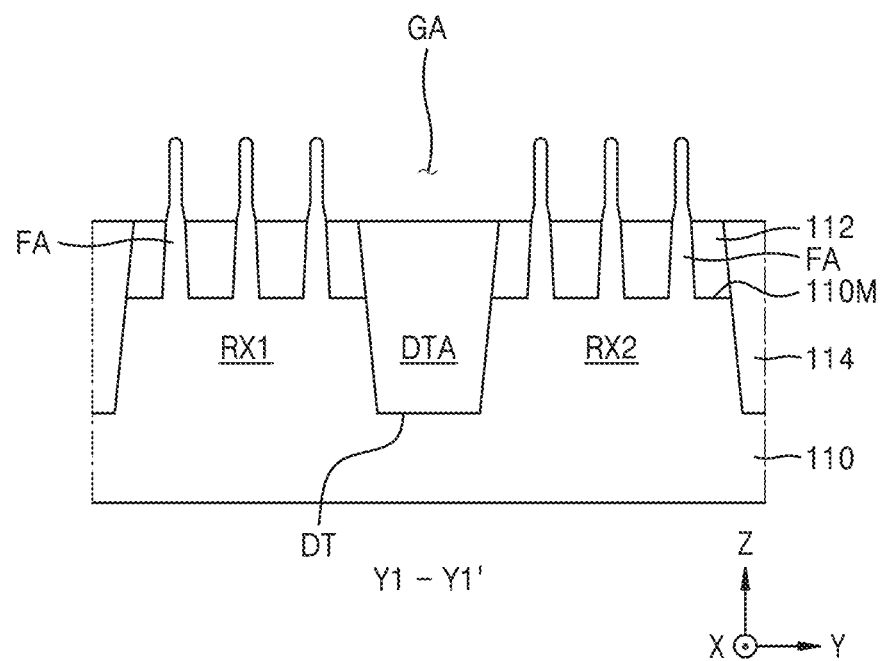
Figure 9C:
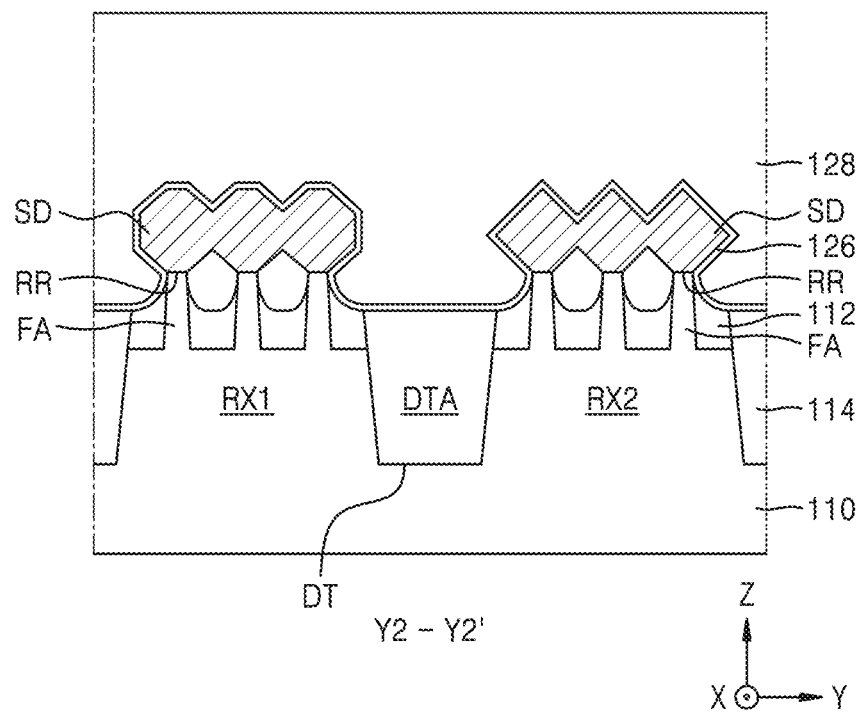

Referring to FIGS. 9A, 9B, and 9C, the plurality of dummy gate lines D14 and the plurality of dummy gate insulation layers D12 may be removed from the resultant product of FIGS. 8A, 8B, and 8C to form a plurality of gate spaces GA. The insulation spacer 120, the plurality of fin-type active regions FA, the device isolation layer 112, and the inter-device isolation insulation layer 114 may be exposed through the plurality of gate spaces GA.

Figure 10A:
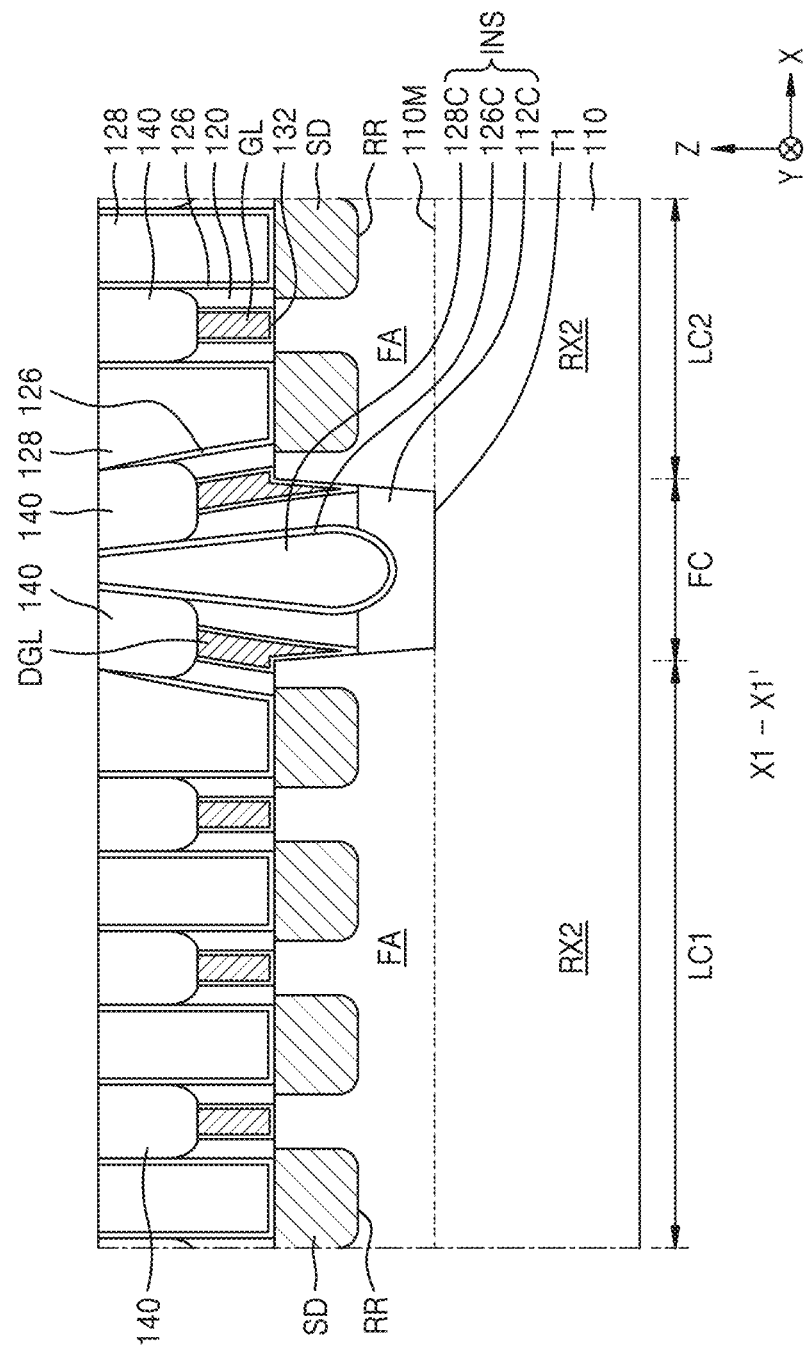
Figure 10B:
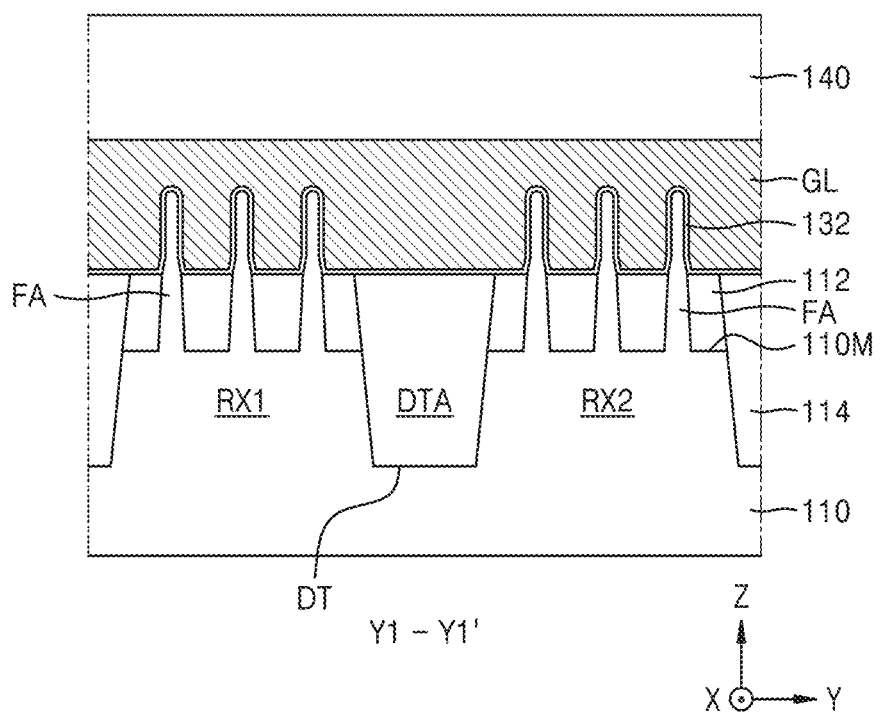
Figure 10C:
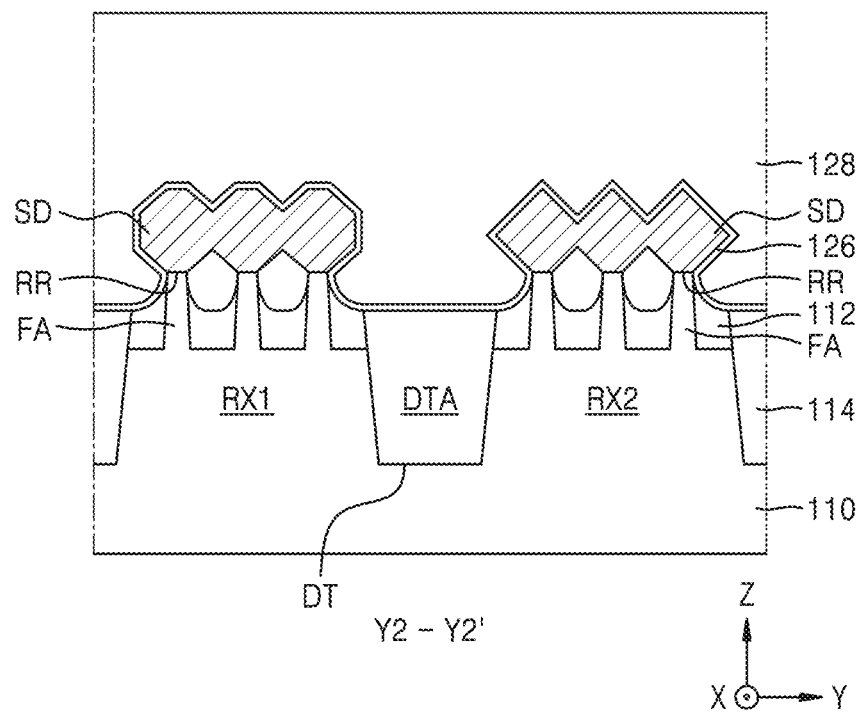

Referring to FIGS. 10A, 10B, and 10C, in a resultant product of FIGS. 9A, 9B, and 9C, the gate insulation layer 132, the gate line GL, and an insulation capping line 140 may be formed inside each of the plurality of gate spaces GA.

In order to form the gate insulation layer 132, the gate line GL, and the insulation capping line 140, first, the plurality of gate insulation layers 132 and the plurality of gate lines GL filling the plurality of gate spaces GA may be formed, and then, the plurality of gate insulation layers 132 and the plurality of gate lines GL may be etch-backed to fill only a portion of a lower portion of each gate space GA to thereby lower the heights thereof. While etch-backing the gate insulation layers 132 and the gate lines GL, a portion of an upper portion of the insulation spacer 120 defining the plurality of gate spaces GA may be also removed to lower a height of the insulation spacer 120. Thereafter, the insulation capping line 140 that covers an upper surface of each of the gate line GL, the gate insulation layer 132, and the insulation spacer 120 in each of the plurality of gate spaces GA and a portion of an upper portion of the gate spaces GA may be formed.

In some example embodiments, before forming the gate insulation layer 132, an interface layer (not shown) covering a surface of each of the plurality of fin-type active regions FA exposed through the plurality of gate spaces GA may be formed. A portion of the plurality of fin-type active regions FA exposed in the plurality of gate spaces GA may be oxidized to form the interface layer.

In some example embodiments, a heat treatment process, such as a laser annealing process and/or a fast thermal annealing process and/or a low pressure thermal process, may be performed while performing the processes described with reference to FIGS. 10A, 10B, and 10C. According to the heat treatment process, due to stresses affecting the regions in which the first logic cell LC1 and the second logic cell LC2 are to be formed and each fin isolation region FC, a dummy gate line DGL adjacent to the fin isolation region FC from among the plurality of gate lines GL may be further inclined toward the fin isolation region FC.

Figure 11A:
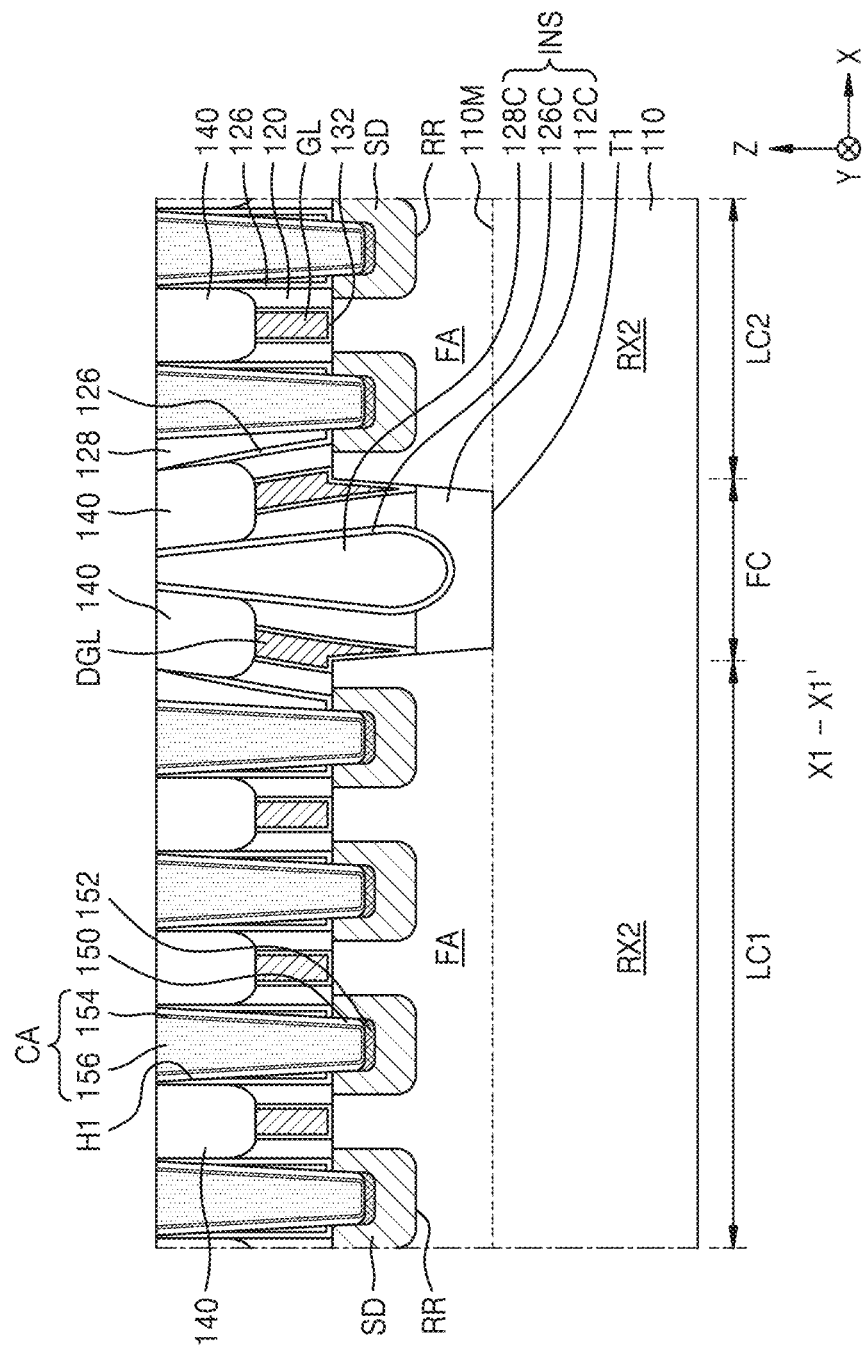
Figure 11B:
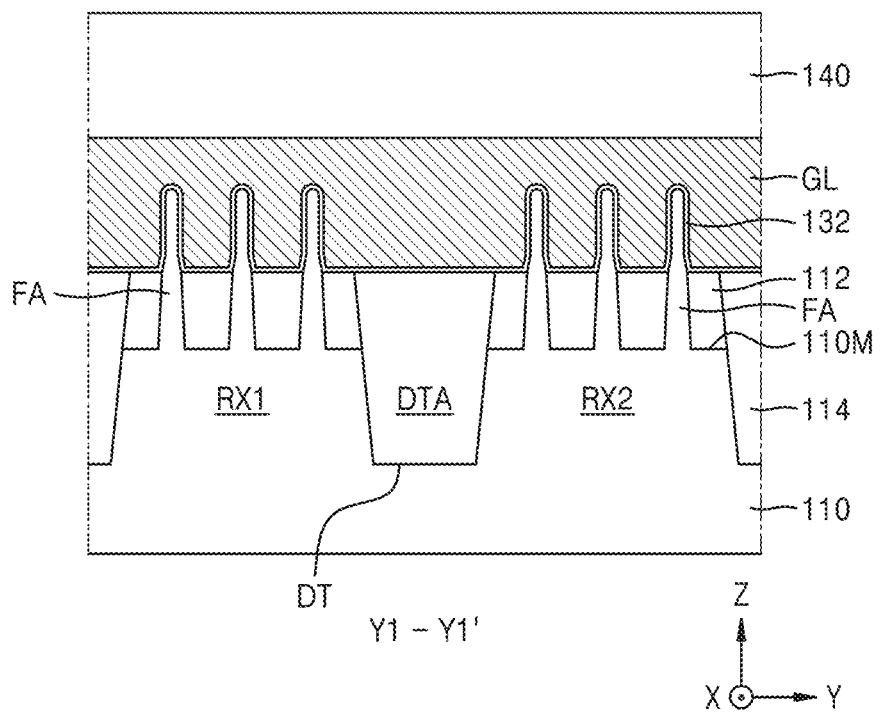
Figure 11C:
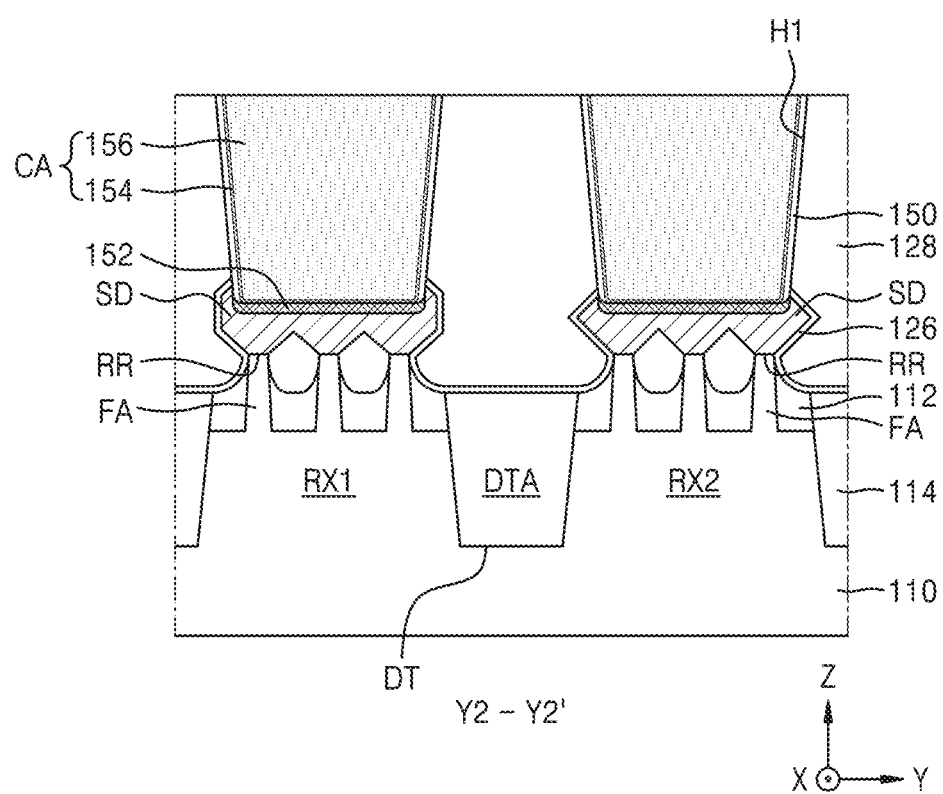

Referring to FIGS. 11A, 11B, and 11C, a plurality of source/drain contact holes H1 penetrating the inter-gate insulation layer 128 and the insulation liner 126 and exposing the plurality of source/drain regions SD may be formed, and then, the contact insulation spacer 150 covering inner sidewalls of each of the plurality of source/drain contact holes H1 may be formed. To form the contact insulation spacer 150, an insulation spacer layer conformally covering inner walls of the plurality of source/drain contact holes H1 may be formed, and then the insulation spacer layer may be anisotropically etched such that the plurality of source/drain regions SD are exposed through the plurality of source/drain contact holes H1. As a result, the plurality of contact insulation spacers 150 which are a portion of the insulation spacer layer remaining on the sidewalls of the plurality of source/drain contact holes H1 may be obtained.

A plurality of metal silicide layers 152 covering the plurality of source/drain regions SD below the plurality of source/drain contact holes H1 and a plurality of the source/drain contacts CA filling the plurality of source/drain contact holes H1 may be formed. The plurality of source/drain contacts CA may be formed to include the conductive barrier layer 154 and the metal plug 156.

In some example embodiments, following processes may be performed to form the metal silicide layers 152 and the plurality of source/drain contacts CA. First, a metal liner conformally covering the plurality of source/drain regions SD in the plurality of source/drain contact holes H1 may be formed. The metal liner may include Ti, W, Ru, Nb, Mo, Hf, Ni, Co, Pt, Yb, Tb, Dy, Er, Pd, or a combination thereof. Thereafter, the conductive barrier layer 154 covering the exposed surface of the metal liner and inner walls of the plurality of source/drain contact holes H1 may be formed. The metal liner and the conductive barrier layer 154 may be formed using a physical vapor deposition (PVD), CVD, or atomic layer deposition (ALD) process. Thereafter, the resultant product on which the metal liner and the conductive barrier layer 154 are formed may be heat-treated to induce a reaction between a semiconductor material constituting the plurality of source/drain regions SD and a metal constituting the metal liner to thereby form the plurality of metal silicide layers 152 covering the plurality of source/drain regions SD. In some example embodiments, after the metal silicide layers 152 are formed, a portion of the metal liner may remain between the metal silicide layers 152 and the conductive barrier layer 154. In other example embodiments, during the formation of the metal silicide layers 152, the entire metal liner may be used to form the metal silicide layers 152 and the metal line may not remain between the metal silicide layers 152 and the conductive barrier layer 154.

Thereafter, a metal layer having a thickness sufficient to fill the inside of each of the plurality of source/drain contact holes H1 may be formed on the resultant product in which the metal silicide layers 152 and the conductive barrier layer 154 are formed. A CVD, PVD, or electroplating process may be used to form the metal layer. Thereafter, unnecessary portions of the conductive barrier layer 154 and the metal layer may be removed by a CMP process to expose an upper surface of the inter-gate insulation layer 128 and form a metal plug 156 including the metal layer remaining on the conductive barrier layer 154 in each of the plurality of source/drain contact holes H1.

Next, as illustrated in FIGS. 3A through 3D, the insulation structure 180 may be formed on a resultant product of FIGS. 11A, 11B, and 11C. The insulation structure 180 may include the etch stopper layer 182 and the interlayer insulation layer 184 sequentially formed on a buried insulation layer 170 and a source/drain contact pattern CAP. Next, the plurality of source/drain via contacts CAV connected to the plurality of source/drain contacts CA and the plurality of gate contacts CB connected to the plurality of gate lines GL may be formed.

In some example embodiments, the plurality of source/drain via contacts CAV and the plurality of gate contacts CB may be formed simultaneously. In other example embodiments, the plurality of source/drain via contacts CAV and the plurality of gate contacts CB may be sequentially formed in separate processes. In this case, the plurality of source/drain via contacts CAV may be formed first, and then the plurality of gate contacts CB may be formed, or the plurality of gate contacts CB may be formed first and then the plurality of source/drain via contacts CAV may be formed.

Figure 12A:
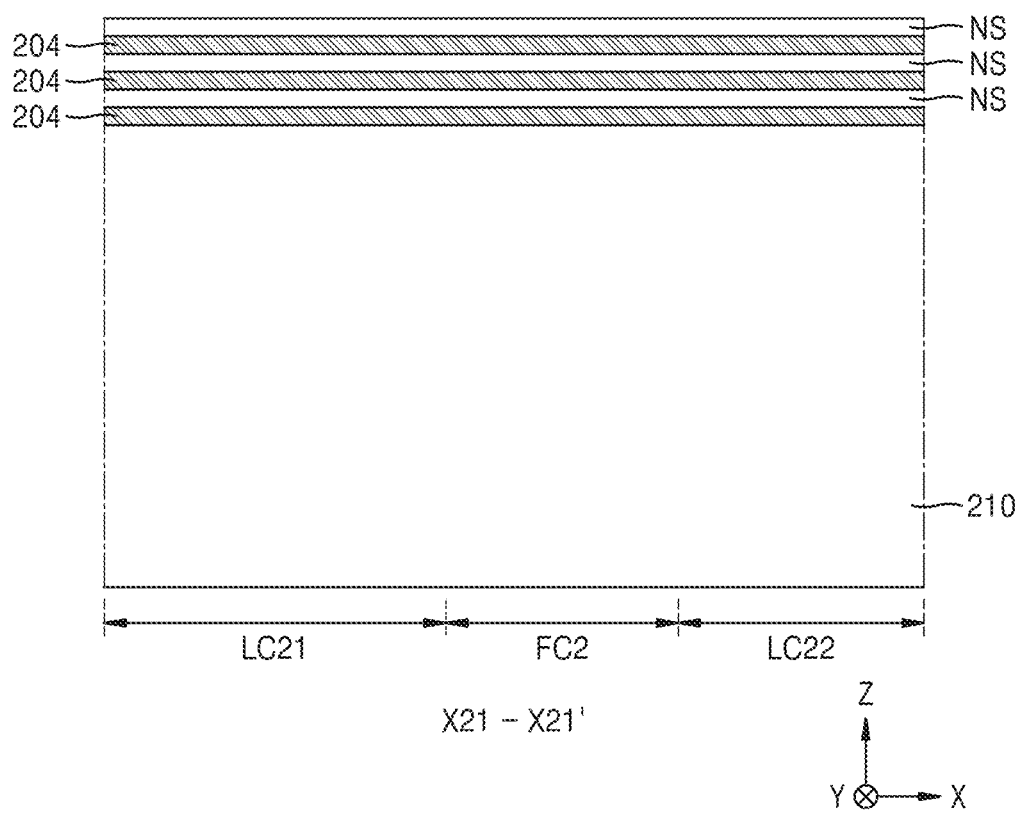
Figure 12B:
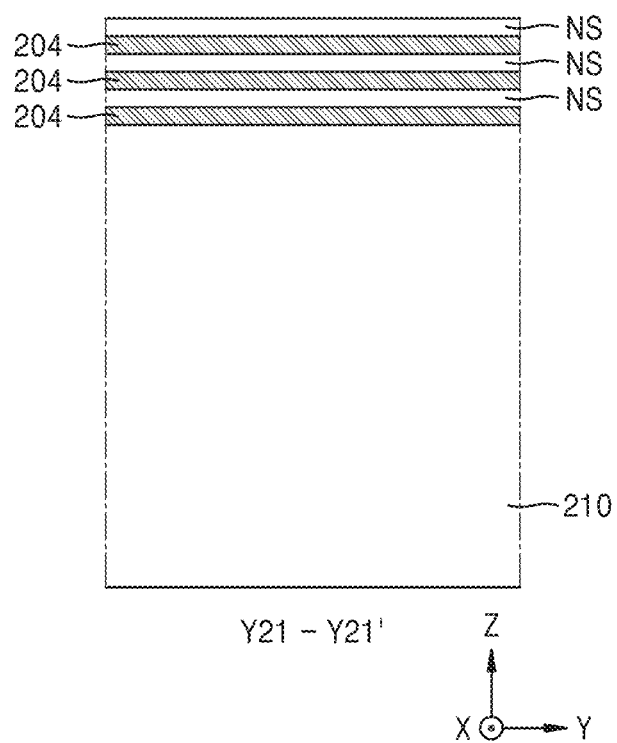
Figure 13A:
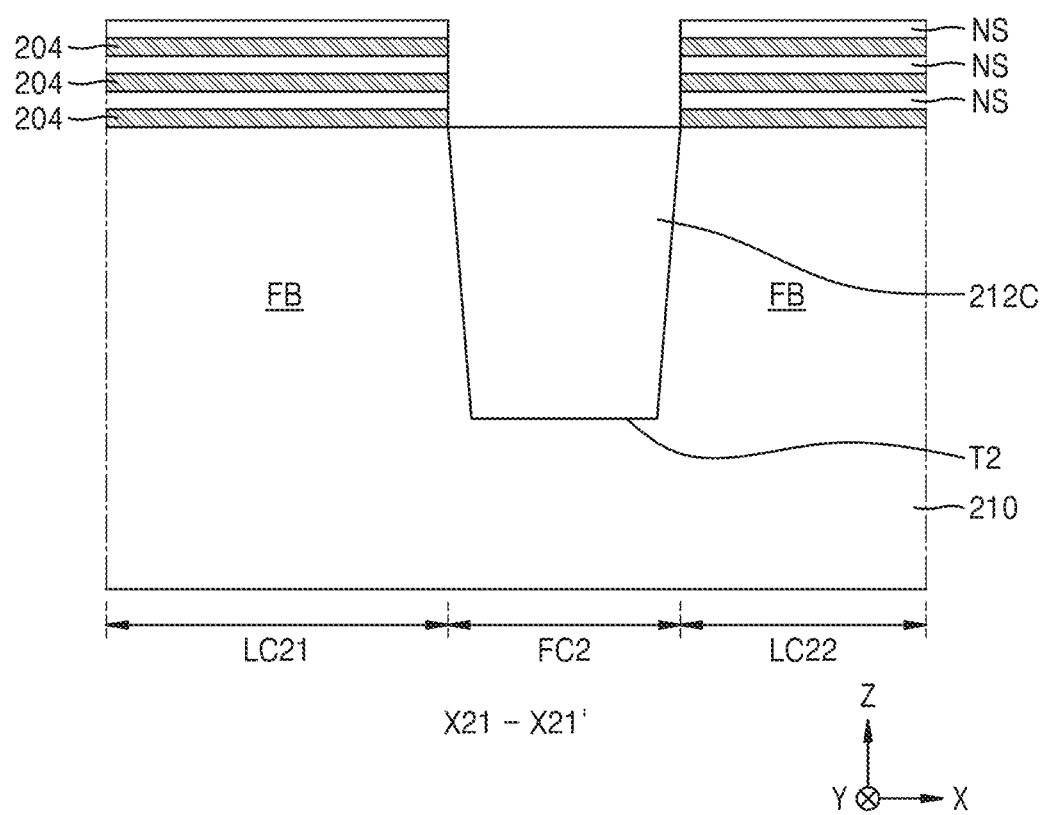
Figure 13B:
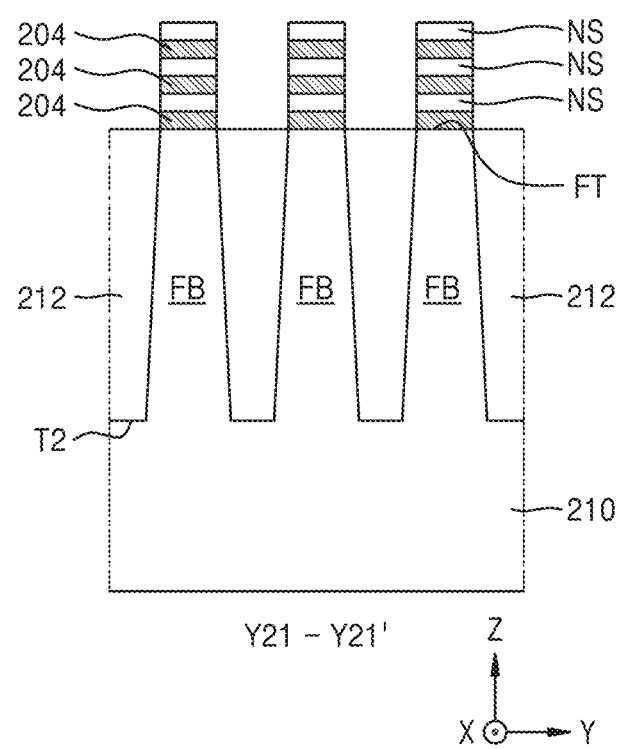

FIGS. 12A through 16B are cross-sectional views illustrating a method of manufacturing an integrated circuit device, according to other embodiments, in a process order, wherein FIGS. 12A, 13A, . . . , and 16A are cross-sectional views of portions corresponding to line X21-X21' of FIG. 4 in a process order, and FIGS. 12B, 13B, . . . , and 16B are cross-sectional views of portions corresponding to line Y21-Y21' of FIG. 4 in a process order. An example method of manufacturing the integrated circuit device 200 illustrated in FIGS. 4, 5A, and 5B will be described with reference to FIGS. 12A through 16B. In FIGS. 12A through 16B, like reference numerals as those of FIGS. 4, 5A, and 5B denote like elements, and detailed description thereof will be omitted here.

Referring to FIGS. 12A and 12B, a plurality of sacrificial semiconductor layers 204 and a plurality of nanosheet semiconductor layers NS may be alternately stacked layer by layer. The plurality of sacrificial semiconductor layers 204 and the plurality of nanosheet semiconductor layers NS may include different semiconductor materials from each other. In some example embodiments, the plurality of sacrificial semiconductor layers 204 may include SiGe, and the plurality of nanosheet semiconductor layers NS may include Si.

Referring to FIGS. 13A and 13B, the plurality of sacrificial semiconductor layers 204, the plurality of nanosheet semiconductor layers NS, and a portion of the substrate 210 may be etched to form the trench T2 in the substrate 210 to form the plurality of fin-type active regions FB in regions in which the first logic cell LC21 and the second logic cell LC22 are to be formed, and the fin isolation region FC2 may be defined between the first logic cell LC21 and the second logic cell LC22. Next, the device isolation layer 212 covering both lower sidewalls of each of the plurality of fin-type active region FC2 and the fin isolation insulation pattern 212C filling a portion of the trench T2 in the fin isolation region FC2 may be formed. The device isolation layer 212 and the fin isolation insulation pattern 212C may be formed simultaneously. The stacked structure of the plurality of sacrificial semiconductor layers 204 and the plurality of nanosheet semiconductor layers NS may remain on the fin upper surface FT of the fin-active regions FB.

Figure 14A:
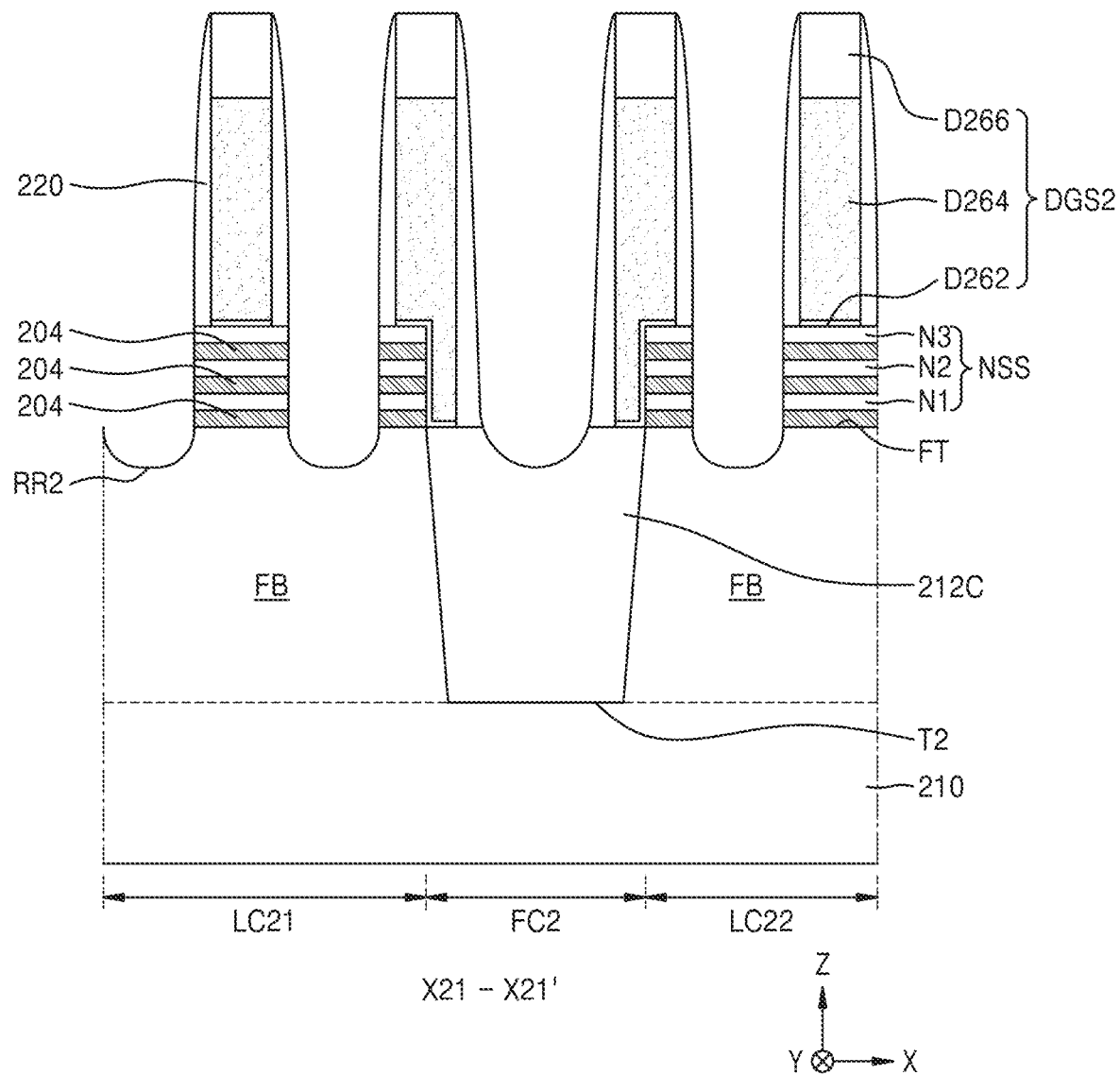
Figure 14B:
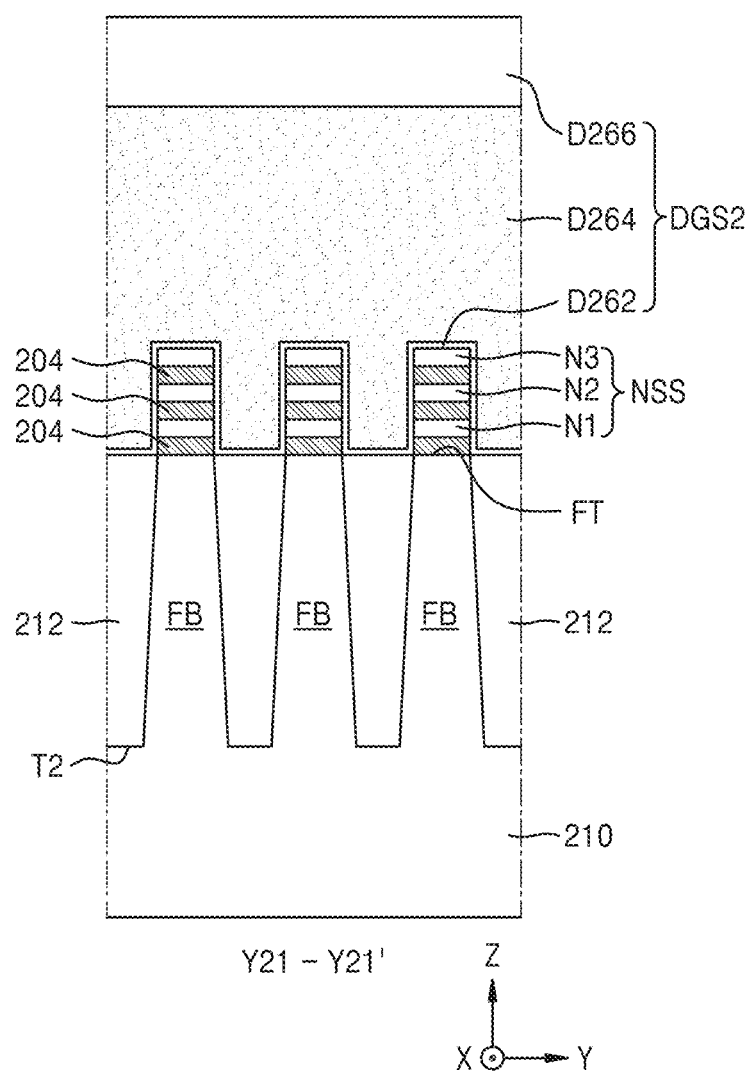

Referring to FIGS. 14A and 14B, in a resultant product of FIGS. 13A and 13B, a plurality of dummy gate structures DGS2 may be formed on the stacked structure of the plurality of sacrificial semiconductor layers 204 and the plurality of nanosheet semiconductor layers NS, and the plurality of insulation spacers 220 covering both sidewalls of each of the plurality of dummy gate structures DGS2 may be formed. Thereafter, a portion of each of the plurality of sacrificial semiconductor layers 204 and the plurality of nanosheet semiconductor layers NS may be etched using the plurality of dummy gate structures DGS2 and the plurality of insulation spacers 220 as an etch mask to divide the plurality of nanosheet semiconductor layers NS into a plurality of nanosheet stacks NSS including the plurality of nanosheets N1, N2, and N3. Next, the fin-type active regions FB exposed between each of the plurality of nanosheet stacks NSS may be etched to form the plurality of recess regions RR2 in the upper portions of the fin-type active regions FB. While the plurality of recess regions RR2 are being formed, a partial region of an upper portion of the fin isolation insulation pattern 212C may be removed.

Each of the plurality of dummy gate structures DGS2 may extend in the second horizontal direction (Y-direction). Each of the plurality of dummy gate structures DGS2 may have a structure in which an insulation layer D262, a dummy gate layer D264, and a capping layer D266 are sequentially stacked. In some example embodiments, the insulation layer D262 may include silicon oxide, the dummy gate layer D264 may include polysilicon, and the capping layer D266 may include silicon nitride.

Figure 15A:
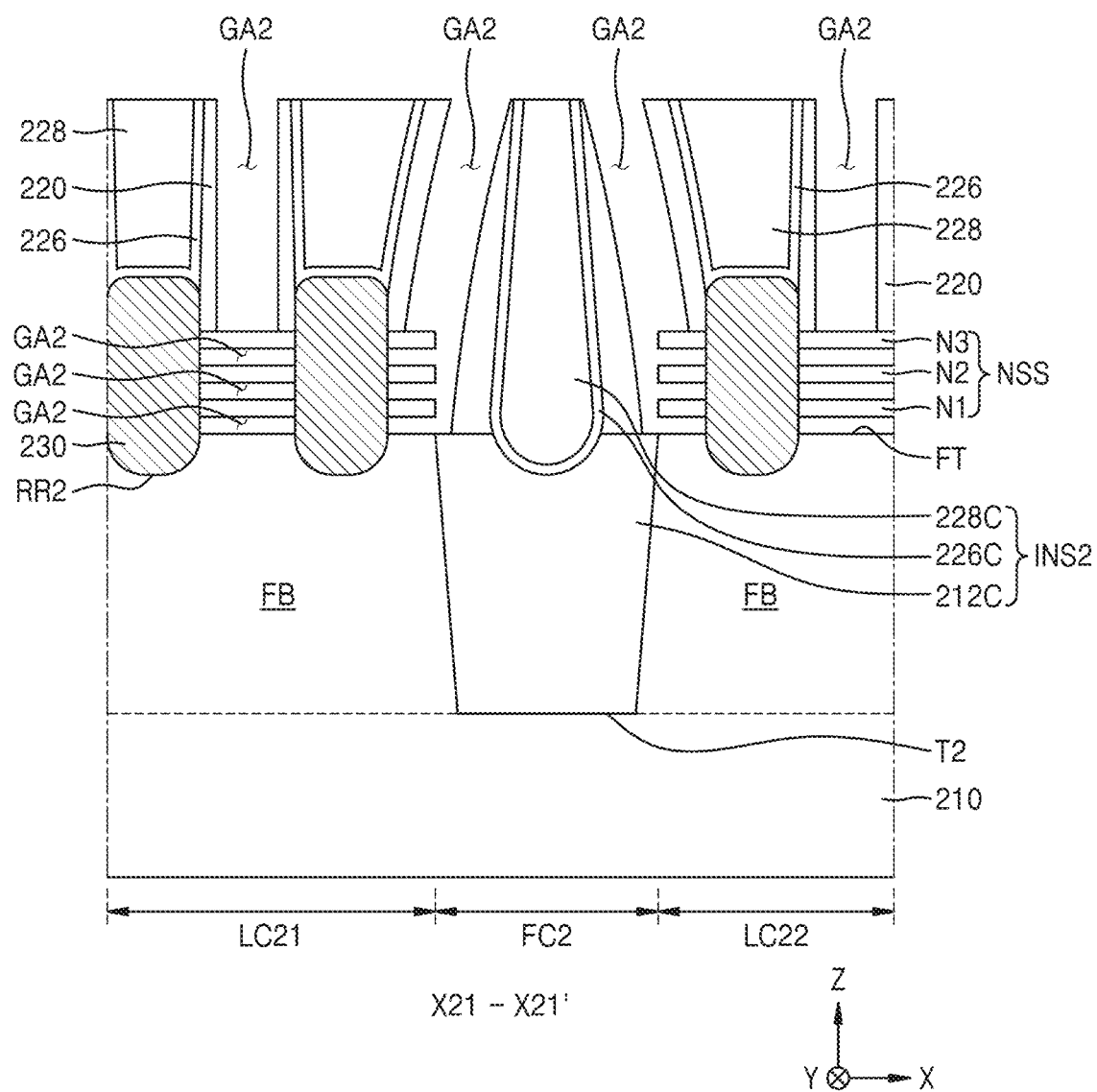
Figure 15B:
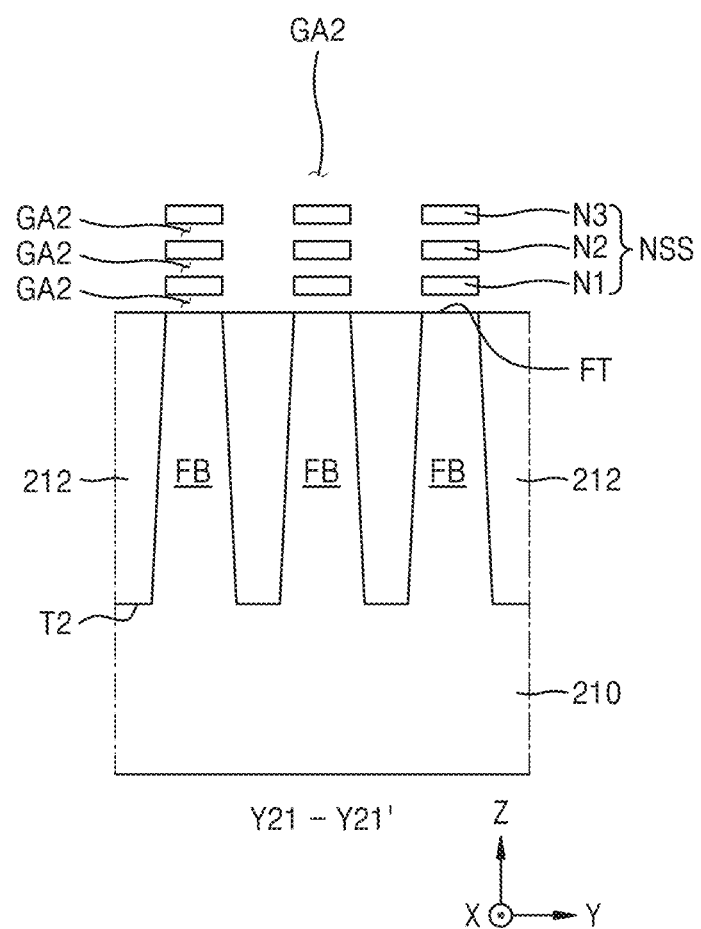

Referring to FIGS. 15A and 15B, in the resultant product of FIGS. 14A and 14B, the plurality of source/drain regions 230 may be formed by epitaxially growing a semiconductor material from exposed surfaces of the plurality of recess regions RR2.

After forming the plurality of source/drain regions 230, a resultant product including the plurality of source/drain regions 230 may be annealed. Here, due to stresses affecting the regions in which the first logic cell LC21 and the second logic cell LC22 are to be formed and the fin isolation region FC2, a dummy gate structure DGS2 adjacent to the fin isolation region FC2 from among the plurality of dummy gate structures DGS2 (see FIGS. 14A and 14B) may be inclined toward the fin isolation region FC2. Accordingly, the dummy gate structure DGS2 may have an inclined shape a shape inclined to be closer to a center of the fin isolation region FC2 in the first horizontal direction (X-direction) from a lowermost surface to an uppermost surface thereof.

Next, the insulation liner 226 covering a resultant product including the source/drain regions 230 and the fin isolation insulation liner 226C covering an exposed surface of the fin isolation insulation pattern 212C in the fin isolation region FC2 may be formed. The insulation liner 226 and the fin isolation insulation liner 226C may be formed simultaneously. Next, the inter-gate insulation layer 228 may be formed on the insulation liner 226, and the fin isolation gap-fill insulation layer 228C may be formed on the fin isolation insulation liner 226C. The inter-gate insulation layer 228 and the fin isolation gap-fill insulation layer 228C may be formed simultaneously.

Next, an upper surface of the capping layer D266 (see FIGS. 14A and 14B) may be exposed by planarizing upper surfaces of the insulation liner 226, the fin isolation insulation liner 226C, the inter-gate insulation layer 228, and the fin isolation gap-fill insulation layer 228C, respectively, and a plurality of gate spaces GA2 may be formed by removing the plurality of dummy gate structures DGS2, and the plurality of sacrificial semiconductor layers 204 may be removed through the gate spaces 204 to extend the gate spaces GA2 to a space between each of the plurality of nanosheets N1, N2, and N3 and a space between the first nanosheet N1 and the fin upper surface FT. As a result, the plurality of source/drain regions 230 may be exposed through the plurality of gate spaces GA2.

In other example embodiments, before forming the plurality of source/drain regions 230 in the process described with reference to FIGS. 15A and 15B, a plurality of indent regions may be formed between each of the plurality of nanosheets N1, N2, and N3 and between the first nanosheet N1 and the fin upper surface FT by removing a portion of each of the plurality of sacrificial semiconductor layers 204 exposed around the plurality of recess regions RR2, and then, a process of forming a plurality of inner insulation spacers (not shown) filling the plurality of indent regions may be further performed. In this case, as described above, after the plurality of sacrificial semiconductor layers 204 are removed in the process of forming the plurality of gate spaces GA2, the plurality of inner insulation spacers (not shown) may be exposed through the plurality of gate spaces GA2.

Figure 16A:
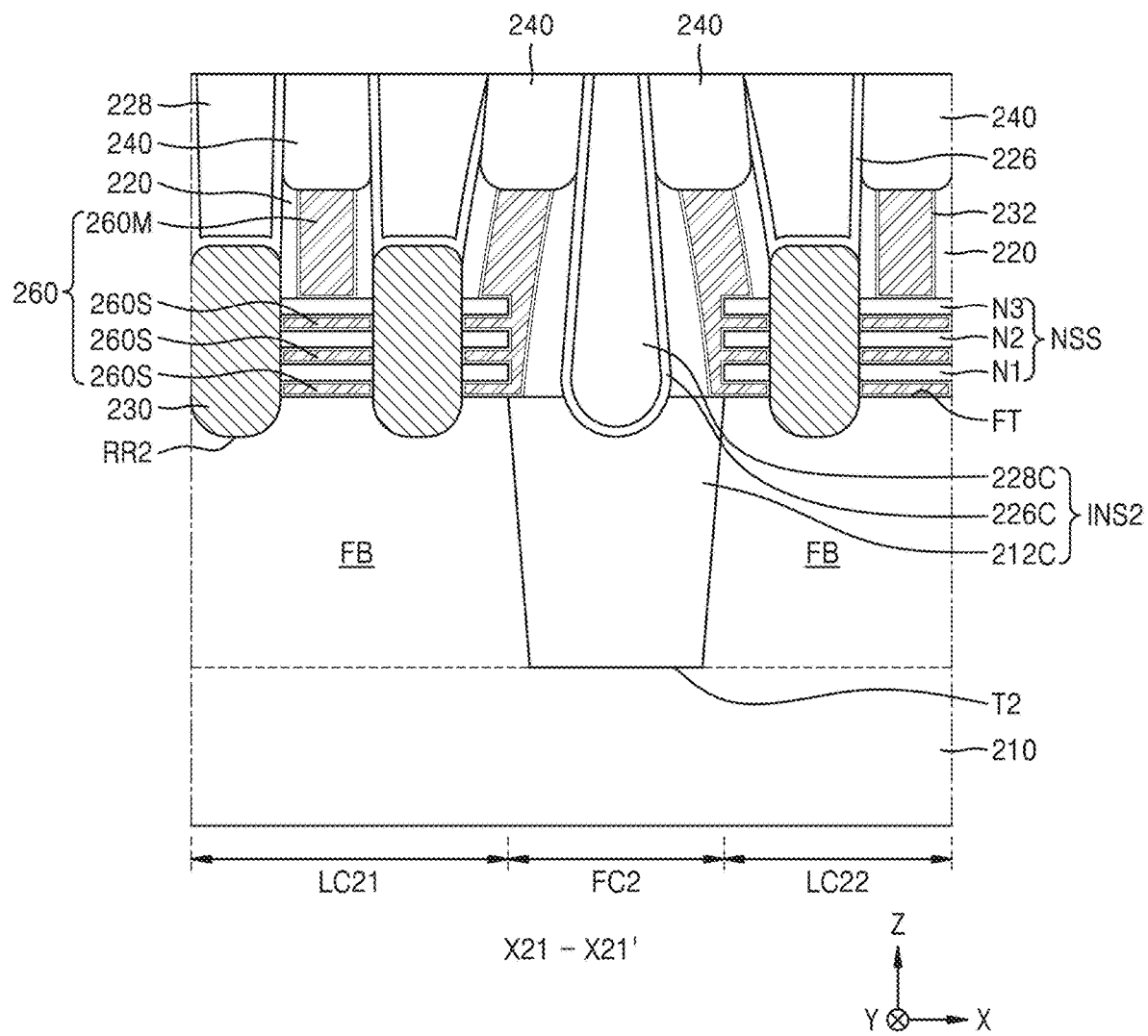
Figure 16B:
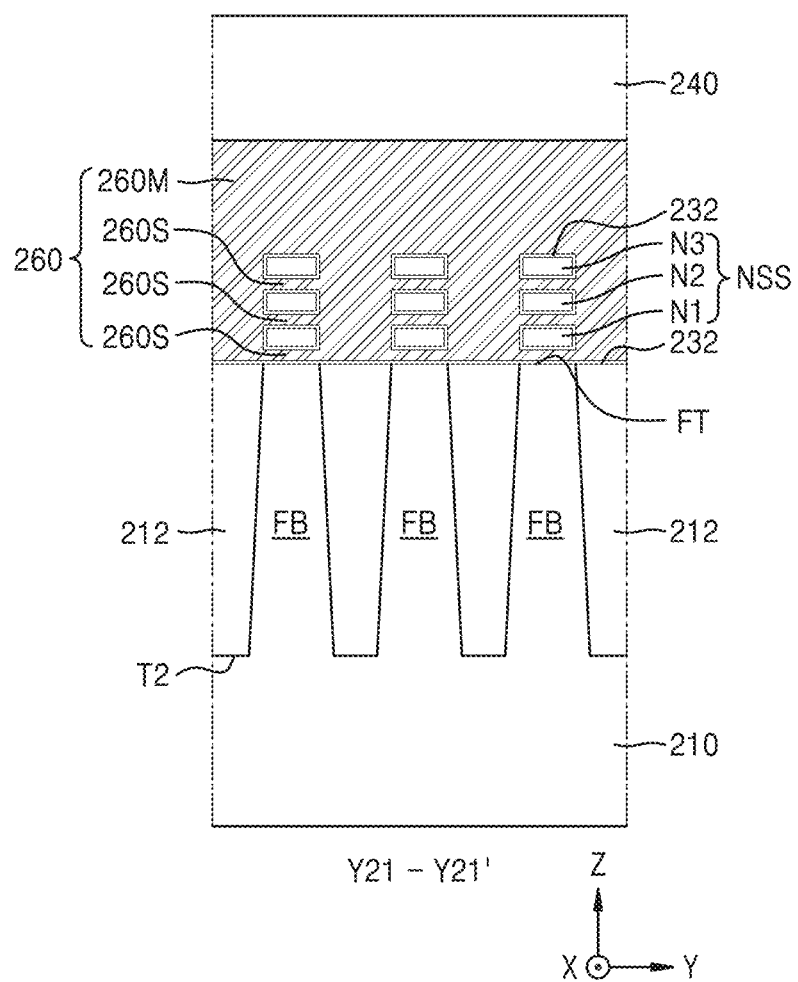

Referring to FIGS. 16A and 16B, in a resultant product of FIGS. 15A and 15B, the gate insulation layer 232 covering the exposed surfaces of the plurality of nanosheets N1, N2, and N3 and the fin-type active regions FB may be formed, and after forming the plurality of gate lines 260 filling the plurality of gate spaces GA2 on the gate insulation layer 232, a portion of an upper portion of each of the plurality of gate lines 260 and the gate insulation layers 232 and the plurality of insulation spacers 220 around the gate lines 260 may be removed such that upper spaces of each of the plurality of gate spaces GA2 are emptied. Thereafter, the upper space of each of the plurality of gate spaces GA2 may be filled with the insulation capping line 240. As a planarization process is performed while the plurality of gate lines 260 and the insulation capping line 240 are formed, heights of the insulation liner 226, the fin isolation insulation liner 226C, the inter-gate insulation layer 228, and the fin isolation gap-fill insulation layer 228C may be lowered.

In some example embodiments, a heat treatment process may be performed while performing the processes described with reference to FIGS. 16A and 16B. According to the heat treatment process, due to the stresses affecting the regions in which the first logic cell LC21 and the second logic cell LC22 are to be formed and each fin isolation region FC2, a dummy gate line 260 adjacent to the fin isolation region FC2 from among the plurality of gate lines 260 may be further inclined toward the fin isolation region FC2.

Next, as illustrated in FIGS. 5A and 5B, the plurality of contact hole H2 penetrating the source/drain regions 230 by penetrating the inter-gate insulation layer 228 and the insulation liner 226 in a resultant product of FIGS. 16A and 16B may be formed, and then, by using a similar method to the method of forming the metal silicide layer 152 and the source/drain contacts CA, described with reference to FIGS. 11A, 11B, and 11C, the metal silicide layer 252 and the plurality of source/drain contacts CA2 may be formed.

While inventive concepts have been particularly shown and described with reference to various example embodiments thereof, it will be understood that various changes in form and details may be made therein without departing from the spirit and scope of the following claims. Furthermore none of the example embodiments are necessarily mutually exclusive with one another. For example, some example embodiments may include features described with reference to one or more figures, and may also include features described with reference to one or more other figures.

What is claimed is:

1. An integrated circuit device comprising:
  a first fin-type active region and a second fin-type active region, the first fin-type active region and the second fin-type active region extending on a substrate in a straight line in a first horizontal direction, the first fin-type active region and the second fin-type active region adjacent to each other in the first horizontal direction;
  a fin isolation region on the substrate and between the first fin-type active region and the second fin-type active region, the fin isolation region comprising a fin isolation insulation structure extending in a second horizontal direction that is perpendicular to the first horizontal direction;
  a plurality of gate lines on the first fin-type active region and extending in the second horizontal direction,
    wherein a first gate line that is closest to the fin isolation region from among the plurality of gate lines is inclined in the first horizontal direction, an inclination from a lowermost surface of the first gate line to an uppermost surface of the first gate line being towards a center of the fin isolation region, and
    wherein the fin isolation insulation structure includes:
      a fin isolation insulation pattern filling a space between the first fin-type active region and the second fin-type active region;
      a fin isolation insulation liner contacting an upper surface of the fin isolation insulation pattern and covering a sidewall of the first gate line, wherein sidewalls of the fin isolation insulation liner are inclined in the first horizontal direction and an inclination from a lower portion of the sidewalls to an upper portion of the sidewalls is towards the center of the fin isolation region; and
      a fin isolation gap-fill insulation layer between the first fin-type active region and the second fin-type active region and filling an upper space on the fin isolation insulation liner,
wherein a lowermost surface of the fin isolation insulation liner and a lowermost surface of the fin isolation gap-fill insulation layer are lower than the upper surface of the fin isolation insulation pattern; and
a plurality of insulation capping lines, wherein each insulation capping line of the plurality of insulation capping lines respectively covers upper surfaces of the plurality of gate lines, and a sidewall of the insulation capping line on the upper surface of the first gate line contacts the fin isolation insulation liner.

2. The integrated circuit device of claim 1, wherein the plurality of gate lines comprise a second gate line which is most adjacent to the first gate line and a third gate line which is adjacent to the second gate line and spaced apart from the first gate line in the first horizontal direction with the second gate line between the first gate line and the third gate line, and
in the first horizontal direction, a first gap between a first upper surface of the first gate line and a second upper surface of the second gate line is greater than a second gap between the second upper surface of the second gate line and a third upper surface of the third gate line.

3. The integrated circuit device of claim 1, wherein the first gate line covers a fin upper surface of the first fin-type active region and sidewalls of the first fin-type active region, the sidewalls faces facing the fin isolation region, and the sidewalls are covered by the first gate line from among a plurality of sidewalls of the first fin-type active region.

4. The integrated circuit device of claim 1, further comprising:
a source/drain region on the first fin-type active region between the first gate line and a second gate line which is most adjacent to the first gate line; and
a source/drain contact between the first gate line and the second gate line, extending in a vertical direction, and connected to the source/drain region,
wherein a first distance between a first upper surface of the first gate line and the source/drain contact in the first horizontal direction is greater than a second distance between a second upper surface of the second gate line and the source/drain contact.

5. The integrated circuit device of claim 1,
wherein the fin isolation insulation liner includes an insulation material not included in the fin isolation insulation pattern, and the fin isolation gap-fill insulation layer includes an insulation material not included in the fin isolation insulation liner.

6. The integrated circuit device of claim 1, further comprising:
a first insulation spacer and a second insulation spacer, the first insulation spacer and the second insulation spacer covering both sidewalls of the first gate line in the first horizontal direction, wherein
the first insulation spacer overlaps the first fin-type active region in a vertical direction,
the second insulation spacer overlaps the fin isolation region in the vertical direction, and
each insulation capping line of the plurality of insulation capping lines on the upper surface of the first gate line covers upper surfaces of the first insulation spacer and the second insulation spacer.

7. The integrated circuit device of claim 1, further comprising:

a first insulation spacer and a second insulation spacer, the first insulation spacer and the second insulation spacer covering both sidewalls of the first gate line in the first horizontal direction, wherein
a lowermost surface of the first insulation spacer contacts a fin upper surface of the first fin-type active region,
a lowermost surface of the second insulation spacer contacts the fin isolation insulation pattern, and
each insulation capping line of the plurality of insulation capping lines on the upper surface of the first gate line covers upper surfaces of the first insulation spacer and the second insulation spacer.

8. The integrated circuit device of claim 1,
wherein the lowermost surface of the fin isolation insulation liner is lower than the lowermost surface of the first gate line.

9. An integrated circuit device comprising:
a first logic cell on a substrate;
a second logic cell spaced apart from the first logic cell on the substrate in a first horizontal direction;
a fin isolation region between the first logic cell and the second logic cell, the fin isolation region including a fin isolation insulation structure extending in a second horizontal direction that is perpendicular to the first horizontal direction;
a first fin-type active region extending in the first logic cell in the first horizontal direction;
a second fin-type active region extending in the second logic cell in the first horizontal direction;
a plurality of first gate lines extending on the first fin-type active region in the second horizontal direction,
wherein an outermost first gate line that is closest to the fin isolation region from among the plurality of first gate lines is inclined in the first horizontal direction, an inclination from a first lowermost surface of the outermost first gate line to a first uppermost surface of the outermost first gate line being towards a center of the fin isolation region, and
wherein the fin isolation insulation structure includes:
a fin isolation insulation pattern filling a space between the first fin-type active region and the second fin-type active region;
a fin isolation insulation liner contacting an upper surface of the fin isolation insulation pattern and covering a sidewall of the outermost first gate line, wherein sidewalls of the fin isolation insulation liner are inclined in the first horizontal direction and an inclination from a lower portion of the sidewalls to an upper portion of the sidewalls is towards the center of the fin isolation region; and
a fin isolation gap-fill insulation layer between the first fin-type active region and the second fin-type active region and filling an upper space on the fin isolation insulation liner,
wherein a lowermost surface of the fin isolation insulation liner and a lowermost surface of the fin isolation gap-fill insulation layer are lower than the upper surface of the fin isolation insulation pattern; and
a plurality of insulation capping lines, wherein each insulation capping line respectively covers upper surfaces of the plurality of first gate lines, and a sidewall of the insulation capping line on the outermost first gate line contacts the fin isolation insulation liner.

10. The integrated circuit device of claim 9, wherein the outermost first gate line comprises a first portion facing a first fin upper surface of the first fin-type active region and a second portion in the fin isolation region outside the first logic cell and closer to the second logic cell than the first portion.

11. The integrated circuit device of claim 9, wherein the plurality of first gate lines comprise a pair of inner first gate lines most adjacent to the outermost first gate line, and in the first horizontal direction, a minimum distance between the outermost first gate line and the pair of inner first gate lines is greater than a minimum distance between the pair of inner first gate lines.

12. The integrated circuit device of claim 9, further comprising:
   a source/drain region on the first fin-type active region between the outermost first gate line and an inner first gate line that is most adjacent to the outermost first gate line from among the plurality of first gate lines; and
   a source/drain contact connected to the source/drain region and extending between the outermost first gate line and the inner first gate line in a vertical direction,
      wherein a first distance between a first upper surface of the outermost first gate line and the source/drain contact in the first horizontal direction is greater than a second distance between a second upper surface of the inner first gate line and the source/drain contact.

13. The integrated circuit device of claim 9, further comprising:
   a plurality of second gate lines extending on the second fin-type active region in the second horizontal direction, wherein
      an outermost second gate line that is closest to the fin isolation region from among the plurality of second gate lines is inclined to be closer to a center of the fin isolation region in the first horizontal direction from a second lowermost surface to a second uppermost surface of the outermost second gate line, and
      each insulation capping line respectively covers upper surfaces of the plurality of second gate lines, and a sidewall of the insulation capping line on the outermost second gate line contacts the fin isolation insulation liner.

14. The integrated circuit device of claim 13, wherein the outermost second gate line comprises a first portion facing a second fin upper surface of the second fin-type active region and a second portion in the fin isolation region outside the second logic cell and closer to the first logic cell than the first portion.

15. The integrated circuit device of claim 13, wherein the plurality of second gate lines comprise a pair of inner second gate lines that are most adjacent to the outermost second gate line, and
   in the first horizontal direction, a minimum distance between the outermost second gate line and the pair of inner second gate lines is greater than a minimum distance between the pair of inner second gate lines.

16. The integrated circuit device of claim 13, further comprising:
   a source/drain region on the second fin-type active region between the outermost second gate line and an inner second gate line that is most adjacent to the outermost second gate line from among the plurality of second gate lines; and
   a source/drain contact connected to the source/drain region, extending in a vertical direction, and between the outermost second gate line and the inner second gate line,
      wherein a first distance between a first upper surface of the outermost second gate line and the source/drain contact in the first horizontal direction is greater than a second distance between a second upper surface of the inner second gate line and the source/drain contact.

17. An integrated circuit device comprising:
   a first logic cell defined by a first cell boundary;
   a second logic cell defined by a second cell boundary spaced apart from the first cell boundary in a first horizontal direction;
   a fin isolation region extending between the first logic cell and the second logic cell in a second horizontal direction that is perpendicular to the first horizontal direction;
   a first fin-type active region extending in the first logic cell in the first horizontal direction to the first cell boundary;
   a second fin-type active region extending in the second logic cell in the first horizontal direction to the second cell boundary, extending in the first horizontal direction and collinear with the first fin-type active region;
   a fin isolation insulation pattern in the fin isolation region and filling a space between the first fin-type active region and the second fin-type active region;
   a first gate line extending between the first logic cell and the fin isolation region along the first cell boundary and comprising a first portion covering the first fin-type active region;
   a second gate line extending between the second logic cell and the fin isolation region along the second cell boundary and comprising a second portion covering the second fin-type active region,
      wherein the first gate line and the second gate line are inclined in the first horizontal direction, an inclination from a lowermost surface of each of the first gate line and the second gate line to an uppermost surface of each of the first gate line and the second gate line being towards a center of the fin isolation region, and
      wherein the integrated circuit device further includes:
         a fin isolation insulation liner contacting an upper surface of the fin isolation insulation pattern and covering sidewalls of the first gate line and the second gate line, wherein sidewalls of the fin isolation insulation liner are inclined in the first horizontal direction and an inclination from a lower portion of the sidewalls to an upper portion of the sidewalls is towards the center of the fin isolation region; and
         a fin isolation gap-fill insulation layer between the first fin-type active region and the second fin-type active region and filling an upper space on the fin isolation insulation liner,
            wherein a lowermost surface of the fin isolation insulation liner and a lowermost surface of the fin isolation gap-fill insulation layer are lower than the upper surface of the fin isolation insulation pattern; and
   a plurality of insulation capping lines, wherein a first insulation capping line of the plurality of insulation capping lines covers an upper surface of the first gate line and a second insulation capping line of the plurality of insulation capping lines covers an upper surface of the second gate line, and sidewalls of the first insulation capping line and the second insulation capping line contact the fin isolation insulation liner.

18. The integrated circuit device of claim 17, further comprising:
- a first inner gate line in the first logic cell on the first fin-type active region and adjacent to the first gate line;
- a source/drain region on the first fin-type active region between the first gate line and the first inner gate line; and
- a source/drain contact connected to the source/drain region, extending in a vertical direction, and between the first gate line and the first inner gate line, wherein
  - a first distance between a first upper surface of the first gate line and the source/drain contact in the first horizontal direction is greater than a second distance between a second upper surface of the first inner gate line and the source/drain contact, and
  - a third insulation capping line of the plurality of insulation capping lines covers an upper surface of the first inner gate line.

19. The integrated circuit device of claim 17, further comprising:
- a second inner gate line in the second logic cell on the second fin-type active region and adjacent to the second gate line;
- a source/drain region on the second fin-type active region between the second gate line and the second inner gate line; and
- a source/drain contact connected to the source/drain region and extending between the second gate line and the second inner gate line in a vertical direction, wherein
  - a first distance between a first upper surface of the second gate line and the source/drain contact in the first horizontal direction is greater than a second distance between a second upper surface of the second inner gate line and the source/drain contact, and
  - a third insulation capping line of the plurality of insulation capping lines covers an upper surface of the second inner gate line.

20. The integrated circuit device of claim 17, further comprising:
- at least one first nanosheet facing a first fin upper surface of the first fin-type active region in a vertical direction at a position apart from the first fin upper surface; and
- at least one second nanosheet facing a second fin upper surface of the second fin-type active region in the vertical direction at a position apart from the second fin upper surface, wherein
  - the first portion of the first gate line surrounds the at least one first nanosheet, and
  - the second portion of the second gate line surrounds the at least one second nanosheet.

* * * * *